United States Patent [19]
Lee

[11] Patent Number: 5,953,255
[45] Date of Patent: Sep. 14, 1999

[54] LOW VOLTAGE, LOW CURRENT HOT-HOLE INJECTION ERASE AND HOT-ELECTRON PROGRAMMABLE FLASH MEMORY WITH ENHANCED ENDURANCE

[75] Inventor: Peter W. Lee, Saratoga, Calif.

[73] Assignee: APLUS Flash Technology, Inc., Santa Clara, Calif.

[21] Appl. No.: 08/998,418

[22] Filed: Dec. 24, 1997

[51] Int. Cl.[6] .................................................. G11C 11/40
[52] U.S. Cl. ................................ 365/185.29; 365/185.3; 365/185.33; 365/185.28
[58] Field of Search ........................ 365/185.01, 189.01, 365/185.19, 185.22, 185.03

[56] References Cited

U.S. PATENT DOCUMENTS

| | | | |
|---|---|---|---|
| 5,060,195 | 10/1991 | Gill et al. ............................ | 365/185.01 |
| 5,111,430 | 5/1992 | Morie ........................................ | 365/49 |
| 5,216,269 | 6/1993 | Middehoek et al. ..................... | 257/318 |
| 5,398,202 | 3/1995 | Nakamura ........................... | 365/189.01 |
| 5,477,068 | 12/1995 | Ozawa ..................................... | 257/214 |
| 5,521,867 | 5/1996 | Chen et al. ......................... | 365/185.33 |
| 5,798,548 | 8/1998 | Fujiwara .................................. | 257/319 |

*Primary Examiner*—Viet Q. Nguyen
*Attorney, Agent, or Firm*—Flehr Hohbach Test Albritton & Herbert LLP

[57] ABSTRACT

An array of MOS memory cells having functionally symmetrical drain and source regions may be programmed and/or erased using low voltage, e.g., less than about 7V. In a NAND-type array, UV-erasure increases threshold voltage Vt to erase memory cell contents, and low voltage-low current hot-hole injection ("HHI") decreases Vt to program the memory cells. For NOR-type arrays, HHI decreases Vt to erase memory cell contents and channel-hot-electron ("CHE") injection increases Vt to program cell contents. Erase and program potentials are low (<7V), enabling arrays to be readily fabricated on a common IC with low voltage circuits. Because HHI strongly converges Vt, the memory cells may store more than two data values, which increases cell storage density. Cell symmetry permits swapping drain for source before cell endurance becomes too troublesome, which swapping can substantially increase the endurance lifetime for an array. Arrays may be used as flash memory, as EPROM replacement, or as one-time-programmable memory.

20 Claims, 16 Drawing Sheets

LOW VOLTAGE, LOW CURRENT HOT-HOLE INJECTION ERASE AND HOT-ELECTRON PROGRAMMABLE FLASH MEMORY WITH ENHANCED ENDURANCE

FIELD OF THE INVENTION

The present invention relates generally to solid state programmable flash memory systems and more particularly to such systems in which erase and programming operations are accomplished without use of high voltage, and to such systems in which the memory cells have symmetrical source and drain regions, permitting interchanging source and drain functions to extend memory cell endurance lifetime.

BACKGROUND OF THE INVENTION

Flash electrically programmable read only memories ("EPROMs") and flash electrically erasable and programmable read only memories ("EEPROMs") are solid state devices that can persistently store digital data.

Flash memory has grown substantially in popularity for storing programs and data due to its ability to re-program data that can be stored in non-volatile fashion. Industrial applications find flash memory frequently used in embedded applications such as microprocessors that can store boot code or house-keeping parameters. Formerly such applications were largely reserved for EPROM devices, but more recently, the market is moving to flash memories. Non-memory system circuits are largely implemented using complementary metal-oxide semiconductor ("CMOS") circuitry, which advantageously operates from low voltage of perhaps 5V or less.

As shown by FIG. 1, an EPROM-type flash cell 10 typically has a metal-on-silicon ("MOS") structure that includes a substrate 12, asymmetrical source and drain regions 14, 16, a floating gate 18 overlying MOS channel region 20 but separated therefrom by a thin layer region 22 of oxide 24. A control gate 26 is formed overlying floating gate 18. For a flash EPROM, it is necessary to surround the source region with a lightly doped region 15 of like-conductivity type dopant. The substrate or bulk 12 is tied to a potential Vbb that typically is ground.

For the NMOS device depicted, substrate 12 is doped with P-type impurities, and the source and drain regions are doped with N-type impurities. For a flash EPROM, N+ source region 14 is surrounded by an N− region 15 to protect the source junction from the large source-floating gate electric field used to electrically erase the cell. (Further details of this Fowler-Nordheim source-region tunneling erase mechanism is described later herein.) This N− region helps reduce electric field magnitude between source nodes and the first polysilicon layer ("poly1, not shown") during erase operations. (By contrast, channel-hot-electron injection programming occurs from the drain region, as described later herein.) In any event, prior art cell 10 will have asymmetrical drain and source regions. In addition to adding to fabrication costs, the asymmetry means that functionally the source and drain regions may not be used interchangeably. (Of course by reversing dopant types, a PMOS device could instead be implemented.)

It has long been recognized that programming efficiency of flash memory cells gradually decreases with increasing erase/program cycles. As the number of erase/program cycles exceeds a limitation, cell 10 will typically fail during programming within a predetermined time. The failure number of erase/program cycles is termed the cell's endurance. While endurance limitations are relatively unimportant for one time programming applications, endurance is a critical concern for re-programmable flash applications, e.g., flash memory used as an EPROM replacement.

Flash memory cell decrease in programming efficiency is believed due to trapping of holes in the thin tunnel oxide that separates the cell substrate from the floating gate. During programming, hot holes are injected from the drain region into the floating gate. But holes that do not receive sufficient momentum can become trapped in the tunnel oxide where they degrade oxide electric fields. As a result, programming efficiency decreases as more and more holes become trapped with increasing numbers of program cycles, with degradation of the cell storage capability, and endurance.

Unfortunately, as described herein, programming conventional flash memory cells such as cell 10 can only be accomplished on the drain region side because the source-drain topography is not symmetrical. Thus, the asymmetrical drain-source regions found in prior art cells precludes interchanging the drain and source functions after substantial hole trapping has occurred, to extend the cell's endurance.

A Vcg voltage coupled to control gate 26 can affect charge stored on floating gate 18, which charge affects the Vt threshold voltage of MOS device 10. The magnitude of charge on the floating gate controls the minimum (or Vt) voltage Vcg that will turn-on device 10, causing drain-source current to flow across the channel region 20. Device 10 is programmed to one of two states by accelerating electrons from substrate channel region 20 through the thin gate dielectric 22 region onto floating gate 18. Because they can only store "0" and "1" data states, such cells are termed binary. Understandably, if it were possible to store more than two data states, a memory array of a given storage capacity could be implemented using fewer cells, or for a given IC chip area, increased storage capacity could be implemented.

The state of device 10, e.g., how much charge is stored on floating gate 18, is read by coupling an operating voltage Vds across source and drain regions 14, 16. The drain-source current Ids is then read to determine whether data stored in the device is a logic level one or zero for a given control voltage level Vcg. Conventional memory cells store only two logic states ("1" and "0"), which may be differentiated by sensing relative current levels, e.g., perhaps 100 $\mu$A versus 10 $\mu$A.

In prior art flash and EPROM memory, a data "1" state results when flash cell threshold potential (Vt) is lowered to define a "low Vt", whereas a data "0" results when cell threshold voltage is increased to define a "high Vt". Table 1, below, depicts the potentials or exposure to ultraviolet ("UV") commonly used to alter Vt in conventional flash or EPROM memory cells.

TABLE 1

| stored data state | Flash | EPROM |
| --- | --- | --- |
| 0 | Vt > 6.5 V | Vt > 6.5 V (after program) |
| 1 | Vt < 3.0 V | Vt < 1.2 V (after UV erasure) |

Although UV erasure has been used for many years, it has associated disadvantages. UV-erasure requires that the memory package include a UV-transparent window through which UV may pass to influence the floating gate. Thus, packaging costs for a UV-erasable memory are increased if the memory is to be re-programmable multiple times. As memory density increases, cell size decreases and it becomes more difficult to effectively erase smaller sized floating gates within a given time interval. Further, UV-erasure is a slow process, requiring perhaps 20 minutes.

Flash memory may be erased by UV (in which case Vt will be reduced to about <2V) or it may be erased electronically (in which case Vt will be reduced to about <3V). EPROM memory may only be erased by UV, in which case Vt will be reduced to about <1.2V. EPROM UV-erased Vt differs from flash UV-erased Vt because EPROM has a higher coupling ratio (e.g., 0.7 compared to 0.5). As described later herein, coupling ratio refers to the effectiveness of voltage transfer from a control gate to a floating gate node.

Two mechanisms are in common use to program a flash EPROM (or to erase a flash EEPROM, whose definitions of erasing and programming are opposite), namely channel-hot-electron ("CHE") injection, and Fowler-Nordheim ("FN") tunnelling. Commonly, EPROM-flash devices use FN-erase mode and CHE-program mode operations, which combination is sometimes referred to as ETOX, for EPROM tunnel oxide technology. On the other hand, EEPROM-flash devices commonly use FN-erase mode, and FN-program mode operations.

Table 2, below, summarizes prior art mechanisms and voltages for erasing and programming conventional memory cells. In Table 2, F-N denotes Fowler-Nordheim tunnelling mechanism, CHE denotes channel hot electron injection mechanism, LC denotes low current, MC denotes medium current, and HV denotes high voltage.

TABLE 2

| CONFIGU-RATION | ERASE mode | | PROGRAM mode | |
|---|---|---|---|---|
| prior art 1 | F-N – LC & HV <10 nA, ±10 V | Vt decreases | CHE – HC & HV 0.5 mA, ±10 V | Vt increases |
| prior art 2 | F-N – LC & HV <10 nA, ±15 V | Vt increases | FN – LC & HV <10 nA, ±10 V | Vt decreases |

Thus, programming prior art memory cells involves increasing Vt such that the state of data stored in the cell changes from 1 to 0, while erasing involves decreasing Vt to change a stored 0 to a 1. As noted above, however, generally F-N tunneling requires higher voltages than CHE injection, which higher potentials can substantially limit memory cell device scaling.

For prior art EPROM-flash cell 10 in FIG. 1, CHE injection programs the cell to an off-state in read mode, by applying high voltage Vcg of perhaps +10V to control gate 26, while applying perhaps +5V to drain 16, and 0V to source 14. The high potential accelerates hot electrons that travel from source to drain, and the electric field created by high voltages Vgs and Vds can pull some hot electrons from the drain to the floating gate. (No electrons will be pulled to the floating gate from the source, which is at ground potential.) When using CHE injection, the drain-source channel current will be approximately 0.5 mA/cell.

If prior art EPROM-flash cell 10 is erased using FN, perhaps –10V is coupled to control gate 26, +5V is coupled to the source, and the drain floats. FN-mode erasing can be accomplished with a tunnel current of approximately 10 nA/cell. (Although one can erase an EPROM-flash cell by providing positive high voltage to the source and grounding the control gate, so doing increases source region junction leak current, and increases hot-hole injection at the source region.)

In the prior art, programming an EEPROM-flash cell using FN technology requires applying approximately –10V to control gate 26, applying +5V to source 14, and floating drain 16. The negative high voltage Vcg and Vs produce a large tunnel electric field that can push electrons from the floating gate 18. to the source 14. (No electrons are pulled out of the floating gate to the drain, as the floating drain will not generate a large electric field.) Unfortunately, this causes hole trapping, and degrades the storage capability and endurance of the memory cell.

To erase an EEPROM cell using FN technology, approximately +15V is applied to control gate 26, while drain 16 and source 14 are grounded. As was the case for an EPROM-flash cell, FN erasing can be accomplished with a tunnel current of approximately 10 nA/cell.

It will be appreciated from Table 2 that, disadvantageously, relatively high voltages are required, e.g., at least about ±10V. Providing these high voltages on the same integrated circuit ("IC") chip containing the memory cells adds to fabrication costs and IC chip size. Further, these high potentials are not voltage compatible with the low voltage (e.g., ≦5V) peripheral devices (or circuits) with which an array of such memory cells will be used. For example, if other circuitry on the IC chip is implemented with CMOS low voltage (≈5V) components, it is necessary to protect these lower voltage components and devices against voltage breakdown due to the high voltages required to erase and/or program conventional memory cells. Often such peripheral devices could be designed to operate safely with much lower breakdown voltage margins, but for the inclusion of on-chip flash circuitry.

For example, in fabricating an IC that includes an embedded flash memory and peripheral devices, the fabrication processes for the peripheral devices must be compatible with fabricating the flash memory, e.g., with fabricating higher voltage components. Having to employ two different fabrication technologies to implement higher voltage EPROM or conventional flash memory, and low voltage CMOS (or other low voltage) peripheral devices can reduce yield and add substantially to the manufacturing cost. For example, producing low voltage CMOS (or other) devices might involve twelve masking steps. However, fabricating higher voltage prior art EPROM and flash memory on the same IC will add several additional masking steps.

In addition to its high potential requirements, another inherent limitation in CHE programming is that the cell array may only be implemented as NOR-type, not NAND-type. (See descriptions of FIGS. 3A and 3B later herein.) FIG. 2 depicts an IC 100 that includes an array 110 of memory cells 10, as well as other peripheral circuits and devices necessary to program and/or erase the array. Also indicated in FIG. 2 are wordlines ("WL") that couple control gates 26 of cells 10 in a horizontal row, bitlines ("BL") and sourcelines ("SL") that, respectively, couple drains 16 and sources 14 of cells 10 in a vertical column.

In many applications, the circuitry with which memory cells 10 are used is powered by a single low voltage power supply, e.g., a 1.2V to 5V battery. Unfortunately, as evident from Table 2, it is necessary to step-up these low potential to the high potentials required to erase and/or program the array of cells 10. On-chip positive and negative high voltage pump circuits 130, 140, 145 generate the ±10V to ±15V ($V_{Pp}$, $V_{Pn}$) high voltage necessary to program and erase memory cells, and +5V ($V_{Pm}$) from a single lower voltage power supply Vdd. A phase generator circuit 125 is also provided to output non-overlapping different phase pulse trains, e.g., $\phi1$, $\phi2$, $\phi3$, $\phi4$ to drive the various positive and negative pump circuits.

Because the various pump output voltages are not especially well regulated, voltage regulator circuits 132, 142, 147 are also provided. (An especially interesting approach to providing well regulated potentials to a memory array is described in applicants' co-pending U.S. patent application Ser. No. 08/884,251 filed Jun. 27, 1997 and entitled NODE-PRECISE VOLTAGE REGULATION FOR A MOS MEMORY SYSTEM. Applicants incorporate said application by reference for a more detailed explanation of problems encountered in prior art approaches to erasing and programming conventional memory cells.)

The output voltages from the voltage regulators shown in FIG. 2 will be logically presented to selected groups of cells to provide WL, BL, and SL potentials as required by the various modes of operation, as exemplified by the values shown in Table 2.

From the foregoing discussions of CHE and FN mechanisms, it will be appreciated that the number of cells that can be erased or programmed in parallel, e.g., simultaneously (or in a "flash"), will often be limited by power output provided by the pump circuitry. Clearly, it would be advantageous if the need to provide or generate high erase and/or programming potential were eliminated. Not only would the design and fabrication of peripheral circuitry be eased, but pump or equivalent circuits could be eliminated. The result would be a more reliable, easier to fabricate IC chip that had more area for storage.

Commonly, a horizontal row of cells having their control gates tied-together defined a WL, whereas a vertical column of cells having their drains tied-together define a BL. Source leads in a block of cells are tied-together to define a SL. Changing the WL, BL, SL potential for a selected group of cells enables those cells to be programmed or erased or verified. For ease of illustration, address logic 120 is shown as having a single output lead, but in practice there will be multiple output leads, including leads for Vgs, Vd, and Vs.

In typical arrays, the gate node of cells 10 are coupled to a WL by a polysilicon conductor (e.g., second layer polysilicon or "poly2") since zero DC current will be carried by the WL. The cell drain nodes are coupled to a typically metal BL, and the source nodes are coupled to a SL, typically via an N+ diffusion. Whereas the WL carries zero DC current, the BL may carry a total 5 mA DC if eight cells in the same WL are simultaneously programmed. The eight BLs typically will come from eight respective sub-groups, in which but a single BL is selected from each sub-group. Further, a SL may carry upwards of 5 mA DC current if 64 Kbytes of cells are collectively erased simultaneously. There will typically be a great many SLs, and the SLs may be combined into sub-groups.

The WLs are coupled to a row-selected device by an row decoder (or X-decoder), which for ease of illustration may be assumed to be associated with address logic unit 120 in FIG. 2. The BLs are coupled to a column-selected device driven by a column decoder (or Y-decoder), which is assumed to be associated with address logic 120. The SLs are coupled to source control circuit, assumed to be associated with address logic unit 120. If array 120 includes 1 Mbit of flash memory cells, there will be 1,024 WLs and 1,024 BLs configured in horizontal rows and vertical columns, in which two WLs typically share one SL.

Array 110 may be implemented using different configurations, namely NAND-type flash memory arrays in which F-N tunneling is used to erase and to program, and NOR-type flash memory arrays in which F-N is used to erase, but CHE injection is used to program. Each has its own advantages and disadvantages, as will now be described.

In FIG. 3A, a NOR-type array 160 of memory cells 10 is shown in which drain leads 16 of the individual cells 10 are parallel-coupled using metallized BLs in a so-called NOR-plane. The source leads 14 for the cells are typically grounded, and individual WL signals are coupled to each cell control gate 26.

In FIG. 3A, if a single cell in the NOR-type array is turned-on, the common BL is discharged through that cell to ground. In a read operation, the WL signal to each unselected cell is grounded, and only the selected cell receives a read WL potential. As the resultant function is similar structurally to conventional NOR-logic gates, such arrays are commonly termed NOR-type arrays.

FIG. 3B depicts an alternative array configuration, namely a so-called NAND-type array. In a NAND-type array 170 the metal BL (often termed the main BL) is coupled at a NAND-plane to a number of serially-connected sub-BLs, e.g., SUB-BL1, SUB-BL2, through an upper and a lower sub-BL select transistor, e.g., M1, M2, M3, M4. Typically the upper select transistor is coupled between the main BL and the drain of the top-most cell in the sub-BL. The lower select transistor is coupled between ground and the source of the bottom-most cell in the sub-BL. In a NAND-type array, to read a cell, the select transistors in the associated sub-BL are turned on, and all other select transistors are turned off, thus coupling the main BL only to the sub-BL containing the selected cell. Within the selected sub-BL, the deselected WL potential (which exceeds the Vt of off-state cells) turns on all unselected cells, while the selected cell receives a WL potential intermediate on-state and off-state in magnitude. Whether the main BL is discharged is determined by the Vt state of the selected cell. Since every cell within the sub-BL must be turned on to conduct BL current, this structure logically is similar to a NAND gate, and is termed a NAND-type array.

In comparing NOR-type and NAND-type memory arrays, several trade-offs are seen. NAND-type flash memory cell size is more compact than NOR-type flash memory cell. But a NOR-plane configuration provides higher read current and there is only one selected cell that conducts current from BL to the SL, often ground. By contrast, a NAND-plane configuration has an upper and lower select transistor, and a series of on-cells within the sub-BL that conduct current. This results in higher overall resistance, which decreases the available read current. In fact, the cumulative series-resistance will be so large as to preclude CHE programming. In CHE programming, perhaps 500 $\mu$A/cell current is present, and the required a Vds $\geq$5V simply cannot be ensured. Thus, NAND-type arrays typically operate more slowly than NOR-type arrays from a given BL potential. For this reason, inexpensive NAND-type arrays find wide use in speech recording devices, in which switching speed may be relatively slow. But the NOR-plane configuration disadvantageously requires a greater cell size to implement than a NAND-plane configuration. Each NOR-plane requires one-half metal contact (shared with an adjacent cell) for a cell to connect to the metal BL. By contrast, the NAND-plane requires only one-half contact (shared with the adjacent sub-BL). Thus, even though a NAND-type array requires an additional upper and lower select pair of transistors per sub-BL, the overall array size is still substantially reduced when compared to a NOR-type configuration. However, as noted above, CHE programming is not compatible with such a configuration.

In summary, there is a need for a system in which programmable flash memory cells may be erased and/or programmed using CMOS-compatible low voltage levels. Preferably such cells should be symmetrical in fabrication so as to permit interchanging source and drain region functions to extend cell endurance lifetime. Further, such cells should be implementable using CMOS technology, without adding more than a few additional process steps. In addition, an array of such cells should be implementable in NAND-type and NOR-type configurations. Finally, such cells should be capable of storing more than two states of data.

The present invention provides such memory cells and a system utilizing such cells.

SUMMARY OF THE PRESENT INVENTION

The present invention provides a flash memory cell whose threshold voltage Vt may be changed using low voltage hot-hole injection ("HHI") as contrasted with high voltage prior art CHE injection programming. HHI advantageously permits programming with low current and low voltage, e.g., CMOS-compatible levels of perhaps 5V or so. In a first embodiment, the cells are erased to an off-state using UV light to alter Vt, and the cells are programmed to on-state using hole injection to vary Vt. In a second embodiment, the cells are erased to an on-state using HHI, and are programmed to an off-state using CHE injection.

The low CMOS-compatible programming voltage requirement advantageously permits fabricating the flash cell with functionally symmetric drain and source regions. The resultant small symmetrical cell geometry simplifies the fabrication process, which may now be compatible with on-chip low voltage peripheral circuits and devices. Further, conventional high voltage charge pumps may be eliminated, freeing up additional IC chip area, and simplifying fabrication.

Because the cell has symmetrical drain and source regions, cell endurance may be approximately doubled by interchanging source and drain functions when excessive trapping becomes apparent.

HHI permits implementing NAND-type and NOR-type arrays, including NOR-type multiple time programmable ("MTP") EPROM that may be implemented with substantially fewer masking steps than prior art MTP devices that do not use HHI. Further, MTP devices provide an automatically self-stopping mechanism to prevent over-erasure, and can erase arays in milliseconds, not seconds (FN-erasure) or minutes (UV-erasure). Erasure may be implemented to be array-way, sub-block wide, or even smaller erase granularity, and erase potential may be obtained from on-chip charge pump circuitry.

Other features and advantages of the invention will appear from the following description in which the preferred embodiments have been set forth in detail, in conjunction with the accompanying drawings.

DETAILED DESCRIPTION OF THE PREFERRED EMBODIMENTS

The present invention provides a low voltage (e.g., $\leq 7V$), low current hot-hole injection erase, and hot-electron programmable flash memory. Erasing and programming may be carried out using low voltages that are compatible with on-chip CMOS and other low voltage peripheral circuitry and devices. Because hot-hole injection can be induced at low current and low voltage levels, the resultant flash memory is CMOS-compatible, and may be implemented using CMOS-logic circuit technology. This substantially reduces cost to manufacture low voltage CMOS logic and flash memory on a common integrated circuit chip. Further, as described later herein, the memory cell provides functionally symmetrical drain and source regions, which permits interchanging drain and source functions to effectively double cell endurance lifetime.

Figure 2:
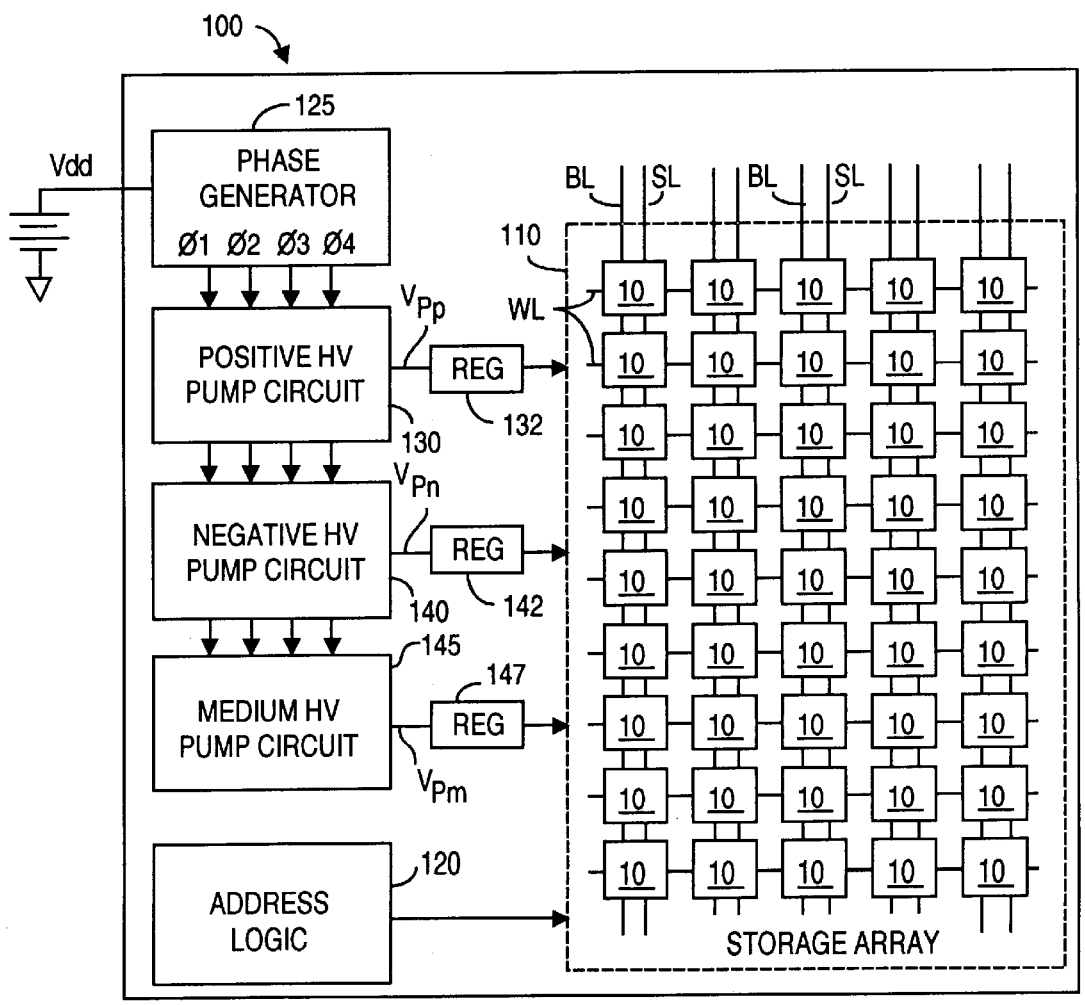
FIG. 2 depicts an IC including high voltage pump circuitry and an array of storage cells, according to the prior art.
Figures 3A, 3B:
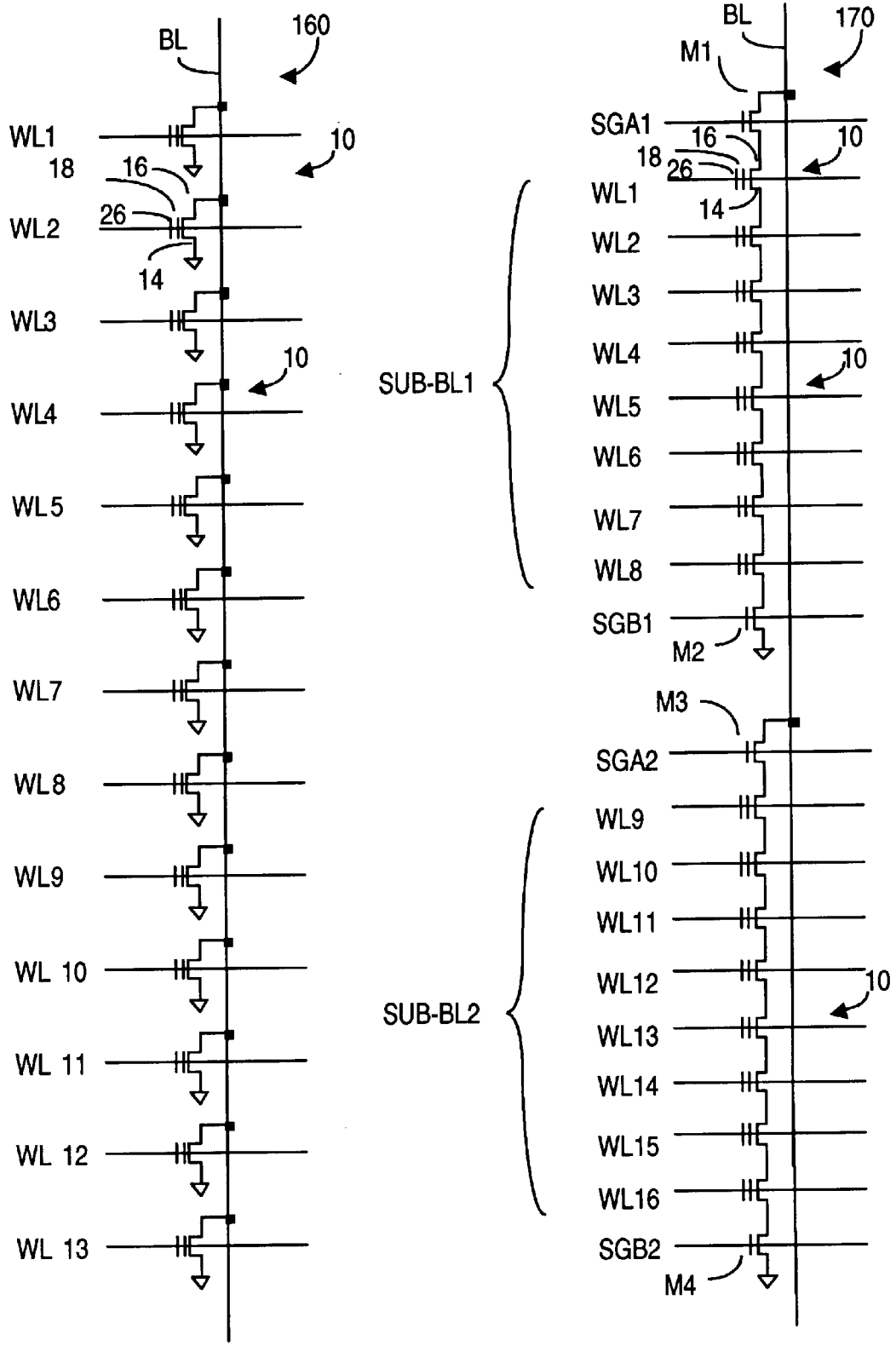
FIG. 3A depicts a NOR-type memory array configuration, according to the prior art.
FIG. 3B depicts a NAND-type memory array configuration, according to the prior art.

As was noted with respect to FIG. 2, prior art memory cell 10 requires an asymmetrical source region 14, 15 relative to drain region 16, to protect the cell in the presence of source-side F-N tunneling current induced electric fields.

By contrast, the present invention does not use F-N tunneling for erasure, and instead uses low-voltage hot-hole injection. Thus, conventional N− lightly doped asymmetrical source regions are not required. This permits fabrication of a cell with symmetrical source and drain regions, in which there is no requirement for light doping, all as indicated by FIG. 4. What is meant by symmetrical, is that the source and drain regions are fabricated to be substantially identical. However during fabrication, it is possible that there may be some slight difference between the regions. Thus, as used herein, symmetrical source and drain regions will be understood to mean source and drain regions fabricated to be substantially identical, which regions are functionally equivalent to one another in that source and drain regions can be used interchangeably.

But for the omission of a lightly doped region 15, and the symmetry of the source and drain regions 14, 16, cell 200 may otherwise be normally fabricated as would a MOS memory cell, for example using present 0.35 $\mu$m technology (or larger geometry). As fabrication techniques become more refined, cell 200 may be fabricated with sub-0.35 $\mu$m geometry.

It will be appreciated that as a result of the symmetrical source and drain regions provided by the present invention, both cell size and manufacturing cost are reduced and device scalability is much improved. Further, because source and drain regions are symmetrical, they may be interchanged, e.g., program and/or erase operations may occur from the source region or from the drain region. The advantages associated with interchangeable source and drain regions is described elsewhere herein with respect to memory cell endurance stress.

An array of such cells may be configured as NOR-type or NAND-type, and individual cells may store more than two levels of data. The resultant low-voltage flash memory cell may be fabricated with conventional CMOS technology, adding only four masking steps to the typically twelve masking steps needed to fabricate low voltage CMOS (or other) on-chip peripheral devices. This is far fewer additional steps than what would be required in the prior art to implement conventional high voltage on-chip flash or EPROM memory. As a result, production control is more readily accomplished when implementing low voltage on-chip memory according to the present invention, than when implementing on-chip high voltage memory, according to the prior art.

Figure 4A:
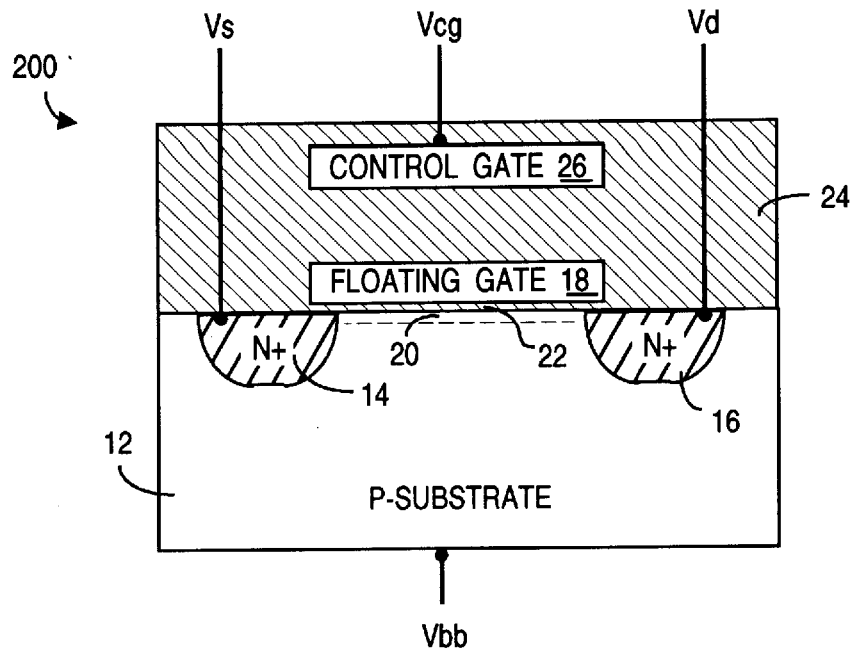
FIG. 4A depicts a symmetrical programmable flash memory storage cell, according to the present invention.

FIG. 4A shows an exemplary symmetrical flash memory cell 200, according to the present invention. It will immediately be observed that source and drain regions 14, 16 are symmetrical and indeed functionally symmetrical, as contrasted with the N+N− asymmetrical source region 14, 15 shown in prior art FIG. 1. Unless otherwise noted, element reference numerals used herein that are the same as those used to describe elements in FIGS. 1–3B may refer to same or identical elements.

Normally a MOS memory cell such as cell 200 is characterized by a threshold voltage Vt. When gate-source potential Vgs exceeds Vt, the cell can conduct substantial drain-source current Ids. When Vgs<Vt, channel current Ids decreases. Channel current that flows when Vds<Vt is referred to herein as sub-threshold current, and the MOS memory cell bias giving rise to such current flow will be referred to as a sub-threshold regime. Thus, if Vgs=Vt results in Ids=1 $\mu$A, then in a sub-threshold regime, Vgs<Vt, and Ids<1 $\mu$A. In a practical example, if Vgs=Vt−0.2V, then sub-threshold current flow Ids<10 nA.

In FIG. 4A, flash memory cell 200 is a stack gate device, in which the uppermost gate, control gate 26 can be fabricated from a second layer of polysilicon ("poly2"), whereas underlying floating gate 18 can be fabricated from a first layer of polysilicon ("poly1"). As such, device 200 appears somewhat as a poly1-gate MOS device with a second poly2-gate stacked above. As described herein, the poly2-gates of various devices 200 are coupled together to form common WLs.

For such a device, poly1-Vt is about 1V and poly2-Vt is about 2V. What the "poly1-Vt" and "poly2-Vt" nomenclature means is that in the NMOS flash memory cell shown in FIG. 4A, there are two Vt values. From the perspective of the poly1-gate (floating gate) Vt (denoted poly1-Vt) is 1V, but from the perspective of the poly2-gate (control gate), Vt (denoted poly2-Vt) is 2V. The 2V versus 1V differential arises from the typically 50% capacitive coupling between poly2 and poly1. If the coupling ratio were say 40% rather than 50%, then poly2-Vt would be about 2.5V contrasted with a poly1-Vt of about 1V.

In a typical cell 200, if drain potential is 5V, then effective capacitive coupling will couple about 0.5V to the poly1 floating gate. This 0.5V is less than the typically 1V poly1-Vt potential, and Ids will be less than perhaps 1 nA.

In practice, the poly2 WL is at ground potential, with drain region potential effectively capacitively coupled to the poly1 floating gate (see below). The result is sub-threshold current conduction of perhaps 10 nA that can accelerate hole velocity. Sufficiently accelerated hole velocity results in hot-holes that can inject into the floating gate, thus lowing cell Vt.

Figure 1:
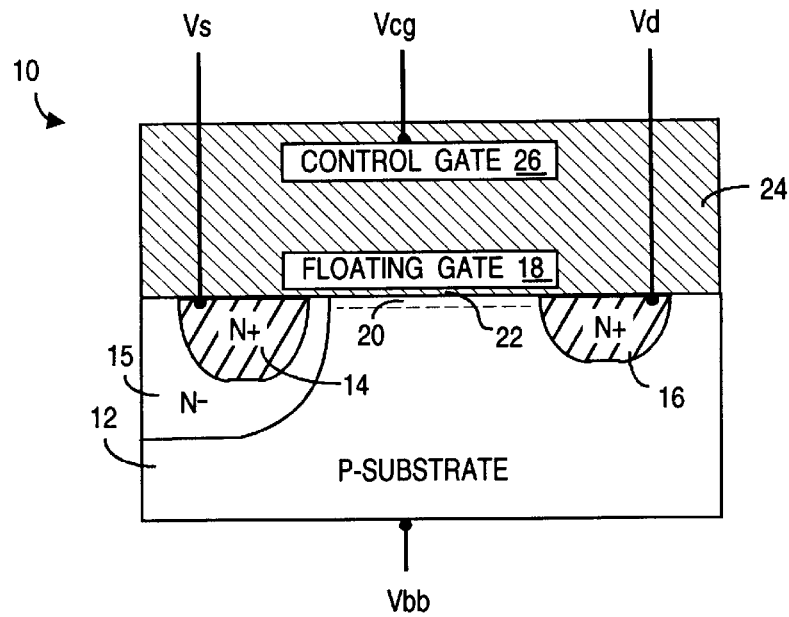
FIG. 1 depicts a conventional asymmetrical EPROM-type storage cell, according to the prior art.

Poly1-floating gate 18 overlaps somewhat source and drain regions 14, 16, and the overlap area forms equivalent coupling capacitors whose dielectric is a portion of intervening thin gate oxide 22. As such, voltages coupled to the source or drain regions can be coupled through the resultant coupling capacitor(s) to the floating gate. The efficiency or coupling ratio is about 0.1 or 10% between drain and floating gate. (For an assymetrical prior art device such as shown in FIG. 1, the couling ratio between the larger source and floating gate is about 0.15 or 15%.) These ratios represent a ratio between effective overlap capacitance between poly1 (floating gate) and drain (or source):total poly1 capacitance with respect to ground. As between poly1 and poly2, more overlapped area is present and the coupling ratio is larger, e.g., about 0.5.

A ratio of 0.1 between drain and floating gate means if 5V is coupled to the drain then effectively 0.5V will be coupled to the poly1-floating gate. This is equivalent to coupling 0.5V to the gate of a poly1-device. Since Vt for a poly1-device is about 1V, a 0.5V poly1-gate potential will conduct sub-threshold leakage current. As noted above, the resultant hot-hole injection decreases cell Vt, according to the present invention.

Thus, capacitor-like coupling can occur from drain (or source, since the regions are symmetrical) to the poly1-floating gate. It will be appreciated that capacitor-like coupling can also occur from the poly2 WL (coupled to the poly2-floating gate) to the poly1-floating gate. Such coupling occurs with an efficiency or coupling ratio that is about 0.5 or 50%, which means if 2V is coupled to the poly2-WL, then 1V will be coupled to the poly1-floating-gate.

As long as the potential at the poly1-floating gate has a positive magnitude less than the poly1 Vt (e.g., <1V), then the poly1-floating gate will produce sub-threshold leakage current that results in hot-hole injection, thus decreasing cell Vt. This mode of decreasing cell Vt results in HHI erasure.

Hot-hole injection erasing uses hot-holes. As used herein, hot-holes are holes or effective positive charges that are accelerated to high speeds by the drain-source potential (Vds) of a memory cell, e.g., memory cell 200 in FIG. 4A. Upon accelerating sufficiently rapidly, such holes acquire sufficient energy to inject through the thin gate oxide 22 of the memory cell and inject into the floating gate 26. The presence of these holes in the floating gate effectively decreases the cell threshold voltage Vt. (By contrast, in prior art configurations, the presence of hot electrons within the floating gate increases the cell threshold voltage Vt.)

In Table 3, below, F-N denotes Fowler-Nordheim tunnelling mechanism, CHE denotes channel hot electron injection mechanism, LC denotes low current, MC denotes medium current, HV denotes high voltage, and UV denotes ultraviolet. The first two rows of Table 3 replicate data from Table 2, for ease of demonstrating the lower voltages with which the present invention may be erased and programmed.

TABLE 3

| CONFIGU-RATION | ERASE mode | | PROGRAM mode | |
|---|---|---|---|---|
| prior art 1 | F-N – LC & HV <10 nA, ±10 V | Vt decreases | CHE – HC & HV 0.5 mA, ±10 V | Vt increases |
| prior art 2 | F-N – LC & HV <10 nA, ±15 V | Vt increases | FN – LC & HV <10 nA, ±10 V | Vt decreases |
| Present invention NAND-type | UV light 0 mA, 0 V | Vt increase | HHI – LC, LV 120 nA, 5 V | Vt decrease |
| Present invention NOR-type | HHI – LC, LV 10 nA, 5 V | Vt decrease | CHE – MC, LV 100 µA, 5 V | Vt increase |

Figure 5:
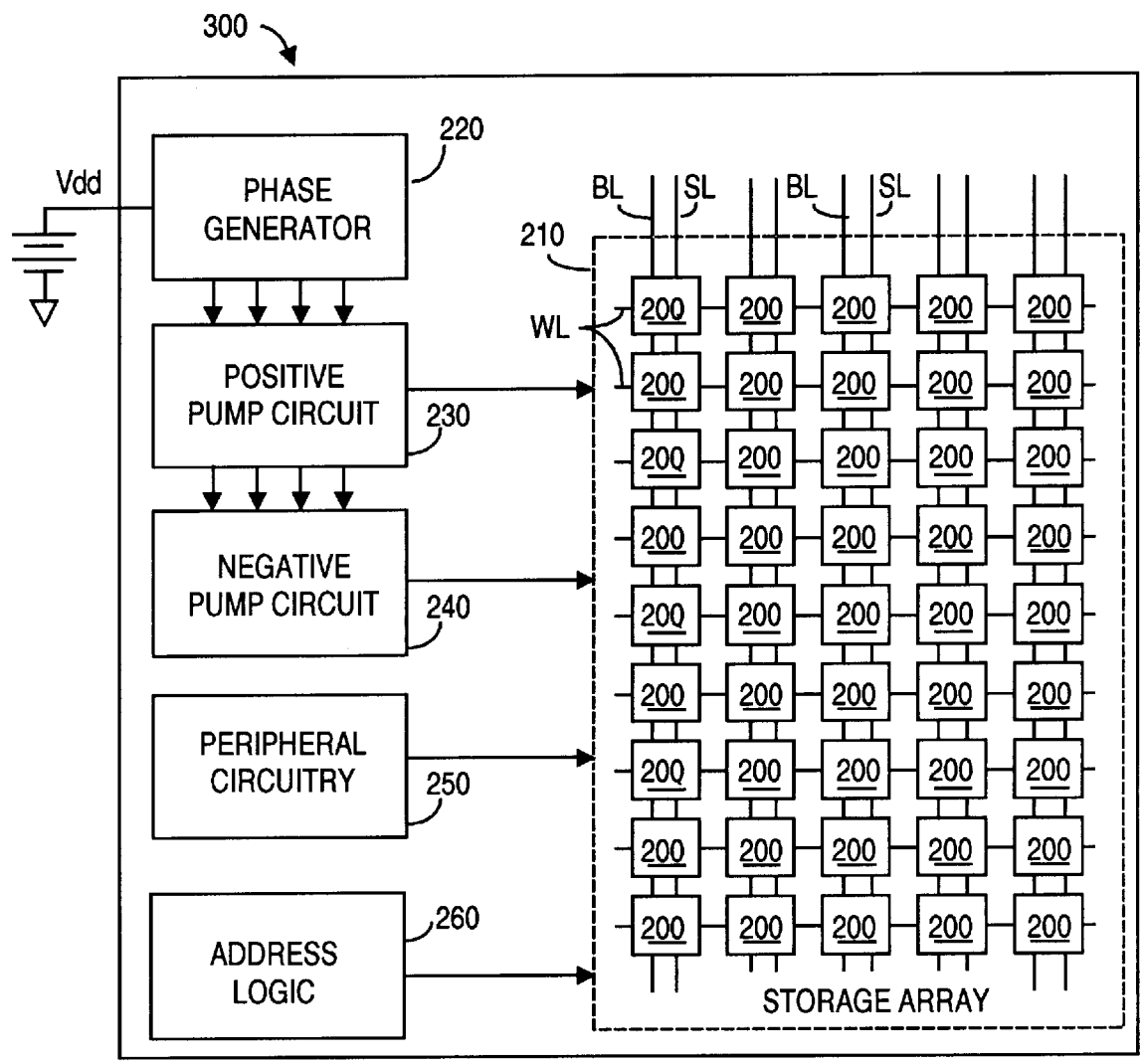
FIG. 5 depicts an IC including an array of symmetrical programmable flash memory storage cells and associated circuitry, according to the present invention.

FIG. 5 depicts an integrated circuit chip 300 that includes an array 210 of flash memory cells 200, according to the present invention. IC chip 300 typically will includes a phase generator 220, positive and negative pump circuits 230, 240, peripheral circuitry and devices 250, and address logic 260, which logic may be similar to address logic 120 in FIG. 2. It is often desired to operate IC chip 300 from a single low voltage source Vdd, often a battery whose voltage may be as low as 1.2V. Thus, to achieve the 5–6 volt potentials required to achieve hot-hole injection erasing and hot-electron programming, it may be necessary to provide on-chip voltage pumps. However, understandably it is easier to provide low current voltage pumps that merely have to step-up Vdd to perhaps 5–6V, rather than provide higher current voltage pumps that must step-up the same Vdd to perhaps 15V.

An especially efficient approach to providing dual-polarity voltage pumps is described in applicants' co-pending U.S. patent application Ser. No. 08/744,200 filed Nov. 5, 1996 entitled POSITIVE/NEGATIVE CHARGE PUMP FOR AN INTEGRATED CIRCUIT.

Hot-hole-injection ("HHI") flash memory according to the present invention may be used as EPROM replacement, as one-time-programmable EPROM ("OTP"), or as pure flash memory. When used as an EPROM replacement, e.g., to hold data that can be programmed one time, IC chip 300 is mounted in a ceramic package that has a crystal window to allow entry of UV light, to erase old data from array 210 of memory cells 200 (see FIG. 5). New data may then be programmed at a user-site using hot-hole injection under control of an external programming unit.

When the flash memory array 210 is used as OTP, the chip may be UV erased during wafer sorting and then mounted in an inexpensive plastic package. After packaging, new data can be programmed once using hot-hole injection. Thus, OTP flash according to the present invention is similar in function to OTP EPROM "like EPROM replacement" Data stored in the OTP can not be re-written because the chip package intentionally has no crystal window to pass UV light needed to erase the stored data. When the present invention is used as conventional flash memory, the chip may be mounted in an inexpensive plastic package, and data will be erased using hole-injection and will be programmed using CHE. The most widely used flash memory technology at present uses Fowler-Nordheim (F-N) tunneling erasure and CHE programming. However, F-N tunneling requires even higher voltage levels than CHE or hole-injection. If F-N erasure is eliminated in a memory unit, a scaling down of the memory device and fabrication technology can be realized.

As was noted with respect to NANA-type flash memory array configurations (see FIG. 3B), F-N tunneling is used to erase and to program. However, from Table 2 it is apparent that F-N tunneling potentials are higher than CHE injection potentials, and can adversely limit device scaling.

To reduce the programming voltage, the present invention provides a new hot-hole injection programming method. A low magnitude positive voltage (e.g., perhaps about 5V to about 7V) is applied to the drain lead 16 of memory cell 200, and a relatively low voltage is applied to control gate 26 and source lead 14. The result is that hot-holes will be injected from the drain region toward the floating gate, which decreases the Vt threshold voltage of the cell. Because the voltage and the current magnitudes required for hot hole injection are relatively low, the present invention is especially suitable for NAND-type flash memory. By combining the advantages of compact size for NAND-type flash with low CMOS-level programming voltage, the present invention provides an excellent solution for many facets of the memory market, speech processing applications, for example.

Because the deep junctions and light doping (see asymmetrical N– region 15 in FIG. 1) that are characteristic of conventional flash memory cells that use F-N erasing can now be eliminated, the present invention can be fabricated symmetrically, which can reduce cell size and manufacturing cost. The present invention may also be used in NOR-type flash memory by combining hot-hole injection erasing and hot-electron injection programming. The result is symmetrical cell structure, as shown in FIG. 4A, and a lower operation voltage. Further, hole injection can be performed bit-by-bit, e.g., to implement small erasing size such as byte-erasing or WL-erasing, according to the needs of the application at hand.

Hot-hole injection programming will now be described with reference to FIGS. 6A and 6B. These figures depict hot-hole injection curves for 1V and 0V Vg gate voltage respectively, while drain and source potentials are 6V and 0V bias, respectively. According to the present invention, drain-source potential must be sufficiently high to induce a sufficient electric field for hot-hole injection. Applicants' experimentation shows that Vg significantly affects the hot-hole injection.

Figure 6A:
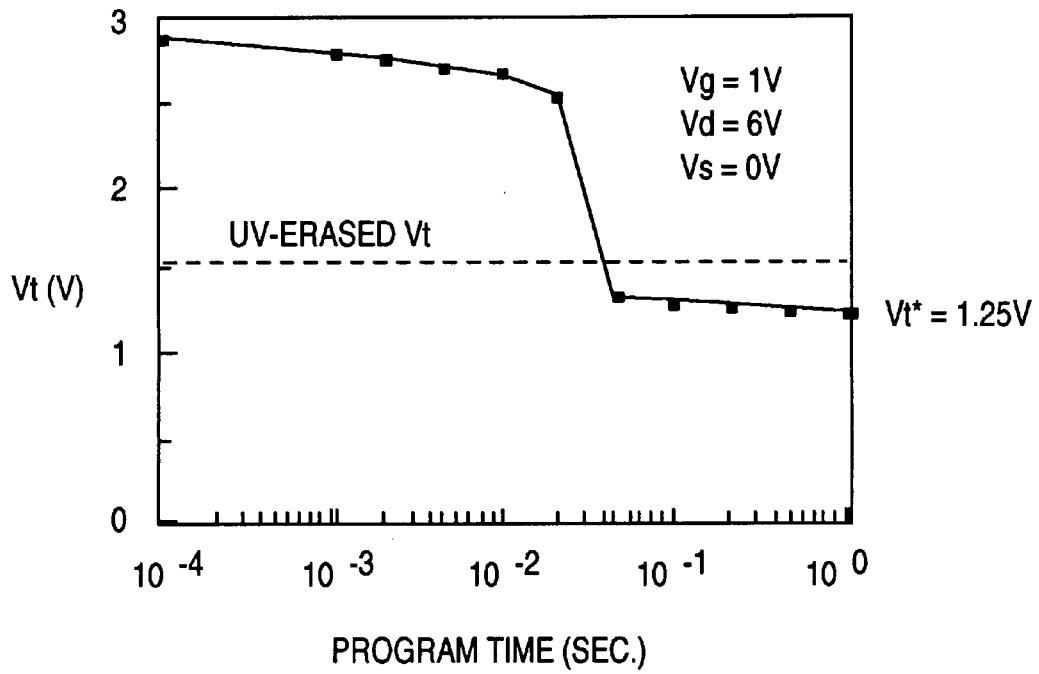
FIGS. 6A and 6B depict hot-hole injection for 1V and 0V gate potentials, respectively, for a symmetrical flash memory cell, according to the present invention.

Note in FIG. 6A that hot-hole injection gradually decreases Vt of cell 200 from an initial 2.8V Vt (a magnitude exceeding the typically UV-erased Vt of 2V), until Vt saturates at a voltage, defined as Vt*, 1.25V in this case. If Vg is reduced to 0V, as shown in FIG. 6B, a cell with initial Vt=2V (e.g., a magnitude exceeding a UV-erased Vt of 2V)

will not experience hot-hole injection. Alternatively, cell Vt (which is less than a Uv-erased Vt of 2V) must as low as about 1.5V to induce hot-hole injection, where cell Vt saturates at 0.25V. As a result, decreasing Vg will decrease both initial Vt (to cause hole injection to occur), and saturation voltage Vt*.

The, the present invention adjusts gate potential during hot-hole injection programming to lower memory cell Vt, which Vt may be higher or lower than the initial UV-erased Vt magnitude. The final programmed saturated Vt for the cell may be adjusted substantially linearly with gate potential.

A programming method involving two (or more) steps of applying programming potential will now be described. The hot-hole injection characteristics described above with respect to FIGS. 6A and 6B may be used to design a useful programming voltage algorithm. Execution of this algorithm will be described with reference to FIGS. 7A–7B. In FIG. 7A, the routine begins at step 400, and at step 410 the cell is UV-erased, using techniques well known to those skilled in the art. Typically, the value of Vt for a UN-erased cell will be perhaps 2V.

At step 420 the first WL in array 210 (see FIG. 5) is logically addressed, and at step 430 all BL latches are logically reset, and at step 440, input data is loaded into the BL latches. At step 450, so-called first step programming pulses are coupled to the selected cells. Also shown at step 450 are the relevant SL and BL potentials for selected and unselected lines.

At step 460, a go-no go test is made to verify whether the selected cell's Vt has been lowered from the UV-erased Vt of less than about 2V down to 1.5V. If yes, the routine passes to step 470 in FIG. 7B, and if not, the routine returns to step 450 for additional programming pulses.

If Vt lowered to 1.5V was verified at step 460, a second step of programming pulses is applied at step 470, using the WL and BL potentials shown therein to further decrease Vt. Step 480 tests whether Vt is now down to 0.5V. If not yet that low, method step 470 is repeated, but if Vt is 0.5V, the routine passes to step 490, which asks whether the selected memory cell is associated with the last WL in the array. If yes, then all relevant cells have been programmed and at step 510 the routine terminates. If the last WL is not associated with the present cell, then the WL is incremented at step 500, and the routine passes back to step 430, and one step, two step programming is repeated for cells associated with the next WL.

Figure 6B:
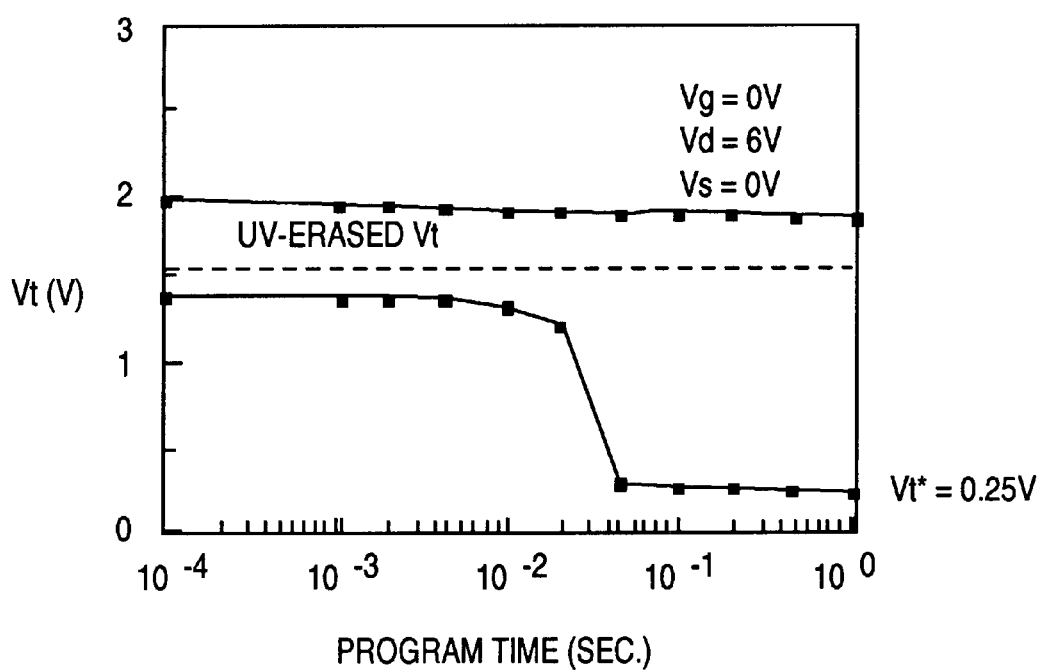
Figure 7A:
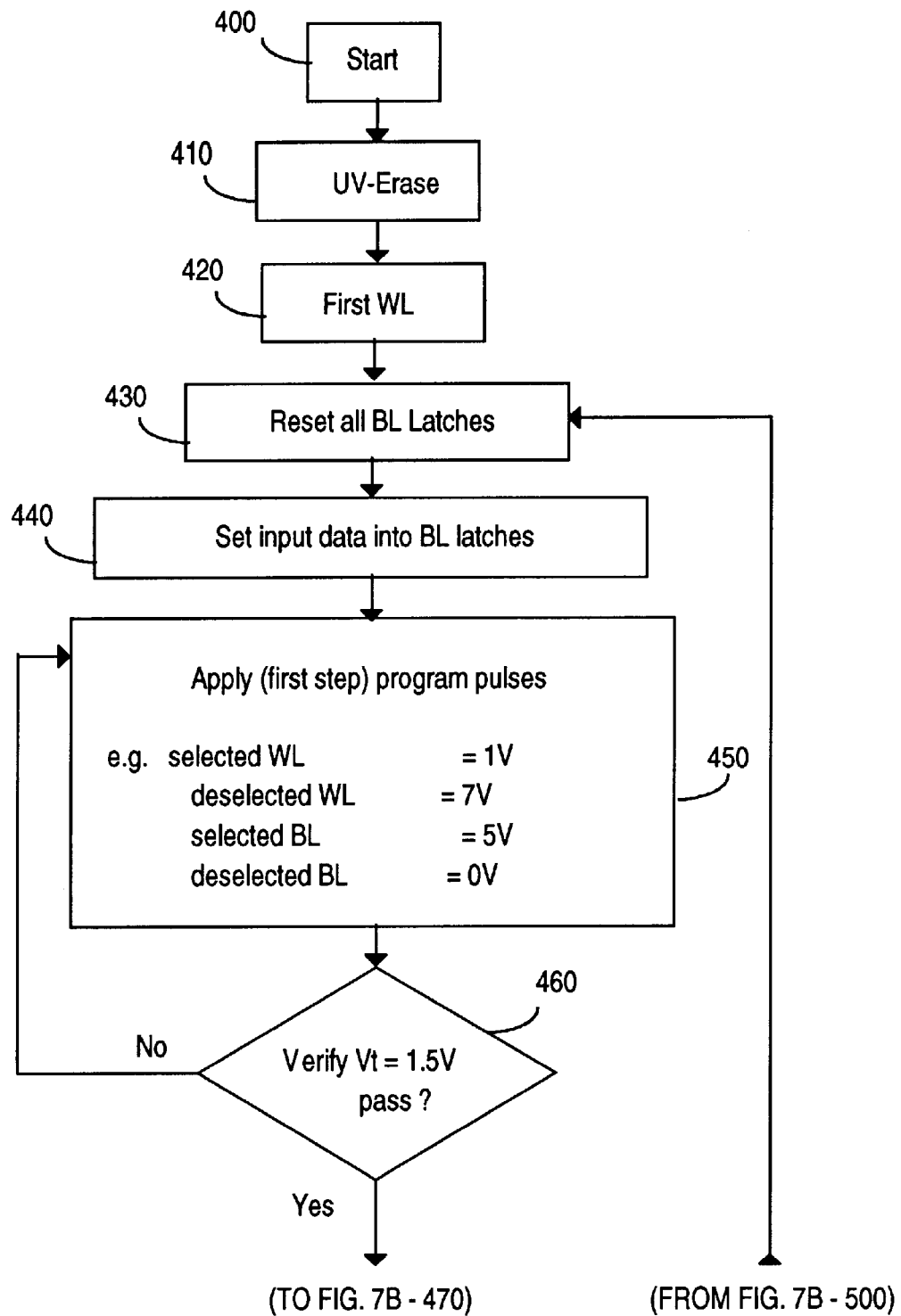
FIGS. 7A and 7B depict a multi-step serially programming routine, useable with the present invention.

For example, if Vt for an off-state cell 200 is <2V (e.g., typical Vt for a UV-erased cell), then only the bias condition of FIG. 6B need be used. But if Vt for the off-state cell were >2V, then two-step programming should be used. The bias condition of FIG. 6A would be applied to decrease cell threshold potential initial Vt to 1.25V in the first step. Thus, the bias condition of FIG. 6B is applied to further decrease cell Vt from 1.25V to 0.25V. A periodic program verification can be performed to determine when to start the second step. Of course granularity of the program increments can be increased from two steps to many steps such that there is a stepwise ramping down of the gate voltage if a wider cell Vt window is desired. It is to be noted that the bias conditions shown in FIGS. 6A and 6B are exemplary and that different bias regimes and characteristics could also be applicable.

A first preferred embodiment in which UV erasing high Vt, and HHI programming low Vt will now be described. In this embodiment, memory cells 200 are erased by UV light and are programmed by hot-hole injection, as described above. Therefore, off-state Vt will be the UV erased Vt, which is typically below 2V in the present technology.

Because this embodiment uses UV erasure, relevant applications will be EPROM replacement or OTP replacement. It is noted that conventional EPROM or OTP use UV erased Vt as "on-state" cells (e.g., low Vt on-state cells whose drain-source current flow represents a stored data "1"), and then use hot-electron injection to program cells to an "off-state" (e.g., high Vt off-state cells that do not conduct measurable drain-source current and thus store data "0").

Alternatively, this present embodiment may use UV erased Vt as "off-state" cells, and then use hot-hole injection to program the cells to "on-state". Because conventional UV erased Vt is approximately 2V, and the cells are programmed to an on-state of approximately Vt=0.5V, the present invention allows low Vdd (e.g. 1.8V) to be directly applied to the selected WL to read data. As such, a voltage pump multiplier would not be required.

This embodiment is suitable for both NAND-type and NOR-type flash memory. While a NAND-type array offers a more compact size, NAND-type arrays have a drawback of slower read access time. Therefore, in applications such as speech recording, is can be especially preferable to use a serial read, as described later herein.

A second embodiment of the present invention that uses hot-hole injection erasing low Vt and CHE programming high Vt will now be described. In this embodiment, hole injection is used in erasing rather than in programming (as was the case for the first embodiment). The cell is erased to an "on-state" using source region HHI with the result that stored "0" data is erased to a "1" state. Further, the cell is programmed to an "off-state" using conventional hot-electron injection occurring in the drain region, in which case a stored "1" is programmed to a "0" state.

This second implementation is similar to conventional NOR-type flash, but erasing is done by HHI rather than F-N tunneling. This operation provides two advantages including the ability to use symmetric cells, and use of scaled-down erase voltage. However, because hot-electron injection requires high cell channel current, this embodiment is far more suitable for NOR-type flash memory than for NAND-type.

The present invention will now be described with respect to an exemplary NAND-type array depicted in FIG. 8A, in which-divided SLs are used. The NAND-type array preferably is erased and/or programmed using the first embodiment above, e.g., UV erasing high Vt, and hot-hole injection programming low Vt. As noted, this type of flash memory is especially suitable as a multiple or one-time EPROM programmable replacement.

Memory array 210' is configured somewhat as conventional NAND-type (e.g., see FIG. 3B), and may in fact be array 210 in FIG. 5. In this configuration, a global BL is fabricated using first layer metal in fabricating IC chip 300. The configurations may include multiple sub-BLs with serial-coupled memory cells 200, according to the present invention.

The sub-BLs are selected by logic signals Al-AM, and the source leads of the horizontal sub-BLs are coupled together. The array shown in FIG. 8A is merely illustrative, and many modifications may be used. For example, one may add select gates on SLs, and/or fabricate vertical SLs. A SL decoder 660 may be used to decode input address signals and, preferably using AND-gate logic, output appropriate decoded SL drive signals, e.g., SL1, SL2, ... SLM.

All cells 200 in the array are preferably erased by exposure to UV light. After erasure, hot-hole injection programming may be carried out bit-by-bit, according to input data that is stored in a top BL-latch array 600. Because hot-hole injection programming speed is on the order of about 10 msec, each BL is provided with a BL latch. So doing can implement 1 Kbyte page programming to achieve 10 μsec/byte equivalent programming speed.

During programming, an external high voltage is applied to the Vpp pad 610 of IC chip 300, which contains the memory array. However, as contrasted with the high 12V programming voltage required for prior art electron-injection, the present invention only requires Vpp of approximately 5V, due to the low-voltage hole-injection used. Since programming may be carried out at the user-site, external Vpp can supply sufficient current for programming all 1K BL simultaneously. Preferably at both sides of the cell array, an X-decoder 620 separates respective odd and even WLs to meet the smaller WL pitch associated with NAND-type memories. Such x-decoder separation may be carried out in conventional fashion.

Input data is latched in the BL latches, and the Vpp pad connects to the power line of all BL latches. A PGMB signal is logic low to provide 5V Vpp to the selected BL, and 0V to the deselected BL, according to the data stored in the BL latches.

Figure 7B:
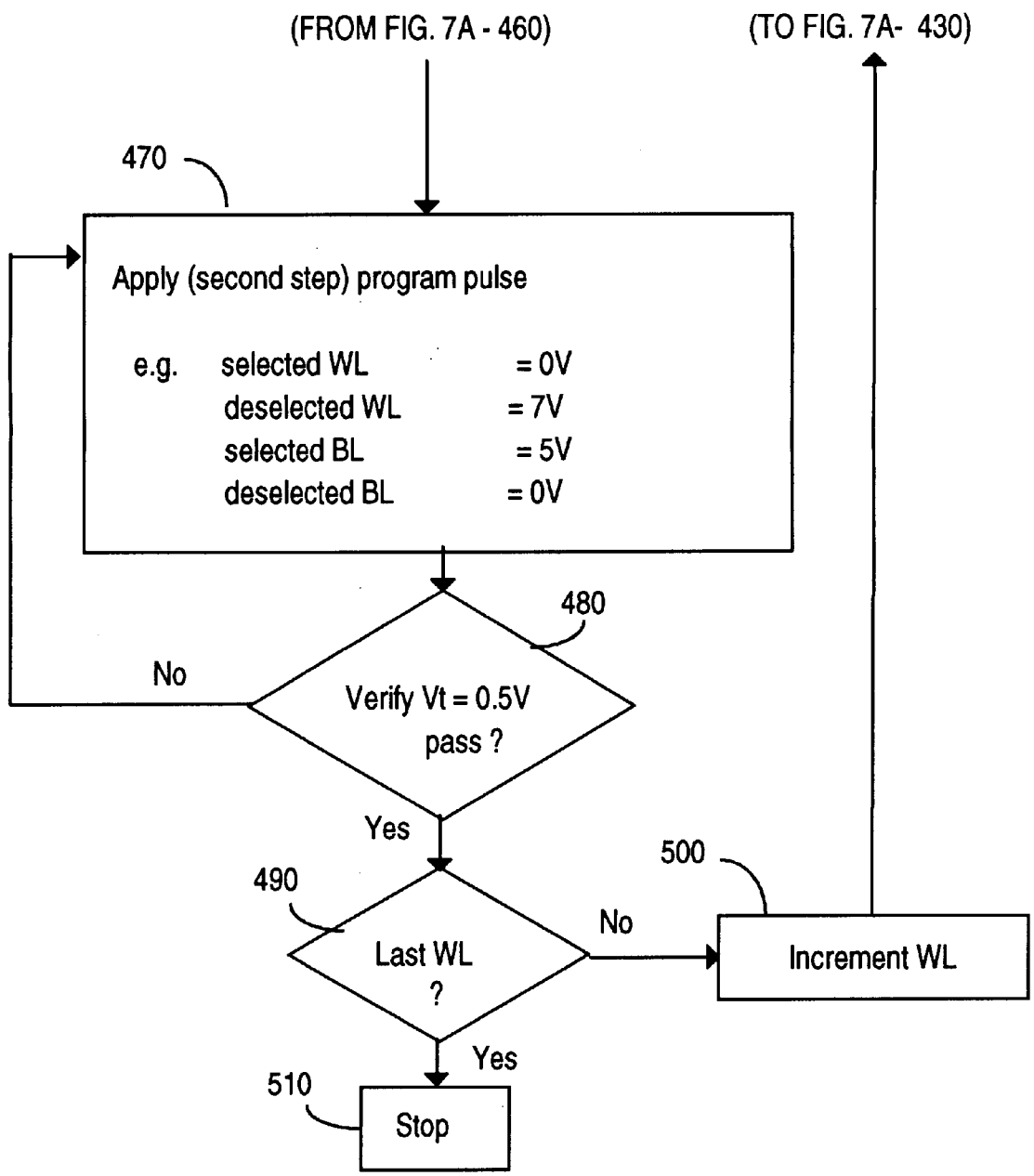

The selected WL is provided with 1V in a first programming step, and with 0V in a second step of programming, if the two-step programming algorithm described with respect to FIGS. 7A–7B is used. Voltage of perhaps 7V is coupled to the deselected WLs to pass the BL voltage (e.g., 5V) to the selected cell. As noted, as used herein voltages of about $\leq$7V are deemed low voltage. A 7V potential is coupled to deselected WLs, e.g., Vgs$\approx$7V, to ensure that Vgs–Vt$\approx$5V, where cell Vt is about 2V. Ensuring that Vgs–Vt=5V will result in a fully passed bitline voltage. This follows because after UV-erasure, Vt$\approx$2V, and BL potential ia about 5V. For an embedded memory used with on-chip low voltage CMOS (or other) devices, a Vt$\approx$0.5V (rather than 2V) would advantageously permit Vgs$\approx$5.5V to ensure fully passing the BL potential. However, even with 7V potentials present, an embedded memory used with the present invention may include low voltage CMOS or other peripheral circuitry and devices, with easier fabrication and less concern for high voltage breakdown, as contrasted with the prior art.

Figure 8A:
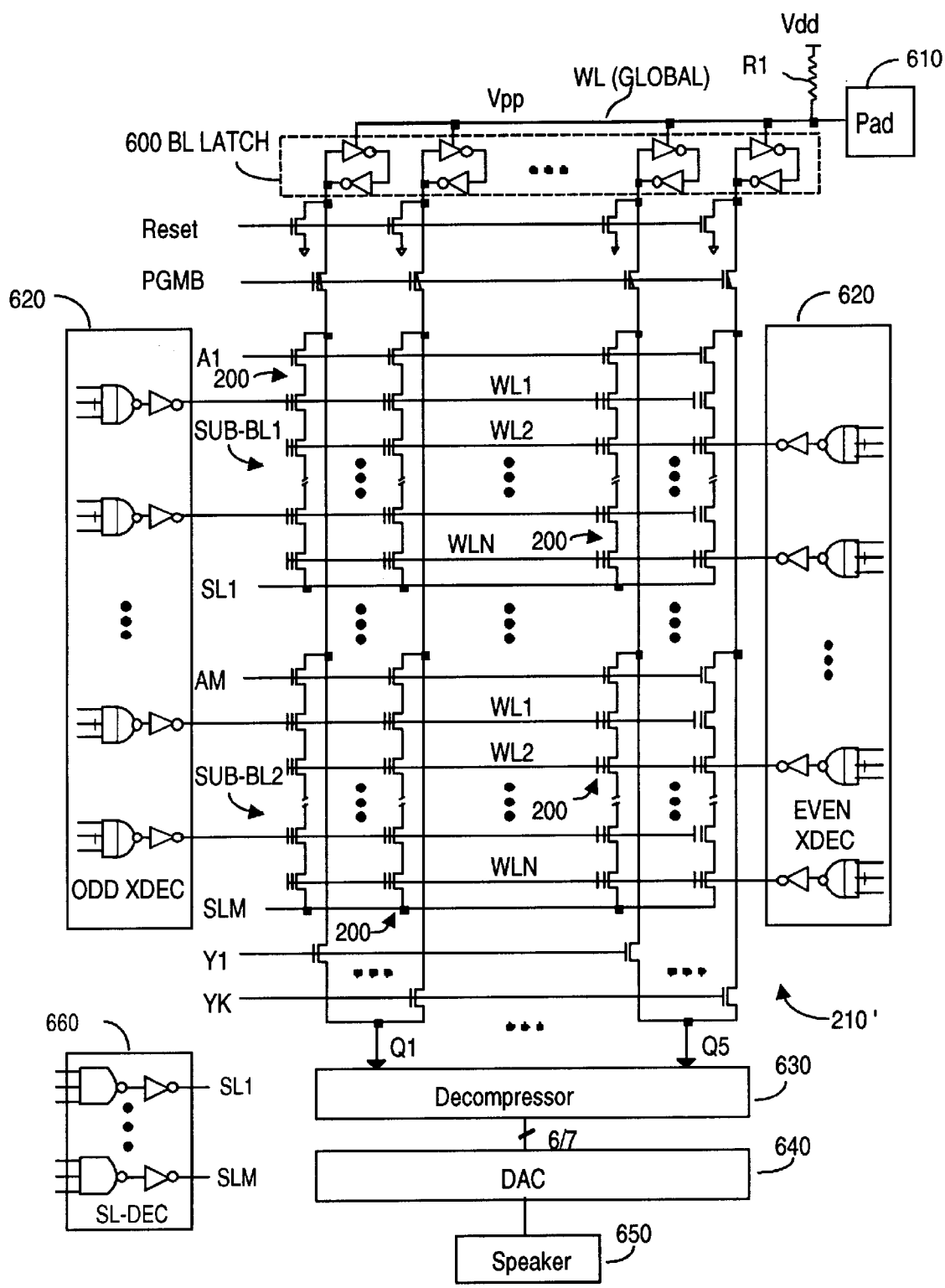
FIG. 8A depicts an exemplary NAND-type array with divided sourcelines, as used in an audio application, implemented according to the present invention.

In FIG. 8A, BL voltage is coupled from the main BL only to the selected sub-BL. Sub-BL selection results from coupling selected gate voltages Al-Am to 6V, to pass the main BL 5V potential to the sub-BL. By contrast, pass-gates associated with deselected sub-BLs are coupled to ground. The deselected sub-BLs are isolated from the main BL by the select transistor of each sub-BL.

As a result, program stress is minimized, which extends endurance cycles, as described more fully later herein. Iterative programming and program-verification preferably are performed to ensure tight distribution of programmed cell Vt. Programming time may advantageously be shortened by carrying out programming on a one-WL by one-WL basis.

After each programming pulse confirmation of completeness of programming is made by reading data from the programmed cell to verify that cell Vt was programmed sufficiently low by the programming pulse. To read the programmed cells, the BL latches are isolated from the BL, and thus stored input data does not affect the BL voltage. The PGMB signal is used to control isolation of the BL latches from the BL in this operation.

For example, to perform program-verification, PGMB goes to logic high (5V), which turns-off the associated PMOS isolation device. This in turn decouples the BL latches from the BL, allowing data in the programmed cell to be correctly read. But in program operation, PGMB is logic low (0V) to fully pass the stored voltage of the latches to the BLs. Of course an NMOS isolation device could be used, but NMOS is less desirable than PMOS in requiring a voltage higher than (5V +Vtn), e.g., $\geq$5.7V, to fully pass 5V from the BL latches to the BLs.

After reading data from the programmed cell, if the read data does not equal the input data, additional programming pulses and program/verify cycles should be applied. Program/verify cycles are repeated until all selected cells successfully pass program-verification.

If selected cells can not pass verification after a predetermined number of pulses, a failure flag is raised. Should programming fail during test operation, the WL decoding devices are disabled and a redundant sub-BL group is used as a replacement for the defective array row. If programming failure occurs after the flash memory product is shipped and especially after endurance testing, programming cycles are increased according to a convertible source/drain programming step, described below.

After UV erasure, cell Vt is typically 2V and after hole-injection programming is typically less than 0.5V and preferably a negative value. This low or event negative Vt permits reading the cells directly using low Vcc, e.g., $\approx$1.8V. NAND-type flash has slower access times than NOR-type flash, and thus is typically used in serial read mass storage applications. For data to be read serially, it must be serially programmed into the array. Stated differently, WLs are preferably sequentially programmed from top to bottom, e.g., in a reverse sequence. Alternatively, WL programming could occur sequentially from bottom-to-top, but flash cells coupled to SL1-SLM in FIG. 8A would experience greater stress.

To program a selected WL, the WL data is first input and latched into the BL latches, which then provide proper voltages for cell programming according to the latched data. After the WL is completely programmed, a counter increments the address to the next WL, and the data of the next WL is input and latched to the BL latches.

Next, programming of the next WL is started. Before new data for the next WL is input, the old data of the previous WL must be cleared. Preferably, a reset signal goes to logic high to clear the data of all the BL latches, and then the data of the next WL is input.

An exemplary NOR-type array will now be described with respect to FIG. 8B. In this embodiment memory array 210" comprises NOR-type flash cells 200, in which the above-described second embodiment of erasing/programming is used. In this implementation, hot-hole injection replaces conventional F-N tunneling to erase cell contents to the low-Vt state. However array programming uses CHE (as used in conventional flash memory) to bring the cells to a high-Vt state.

Many advantages are realized by this embodiment of the present invention, in which conventional F-N erasing and its required high tunneling voltage are eliminated. The present invention erases using low-voltage, e.g., CMOS-compatible voltages of $\leq$55V, to provide hole-injection erasure. The resultant memory cell may now be fabricated with symmetrical drain/source regions. This permits a reduction in device geometry as well as a simplification in fabrication, with increased yield and reduced manufacturing cost.

Figure 8B:
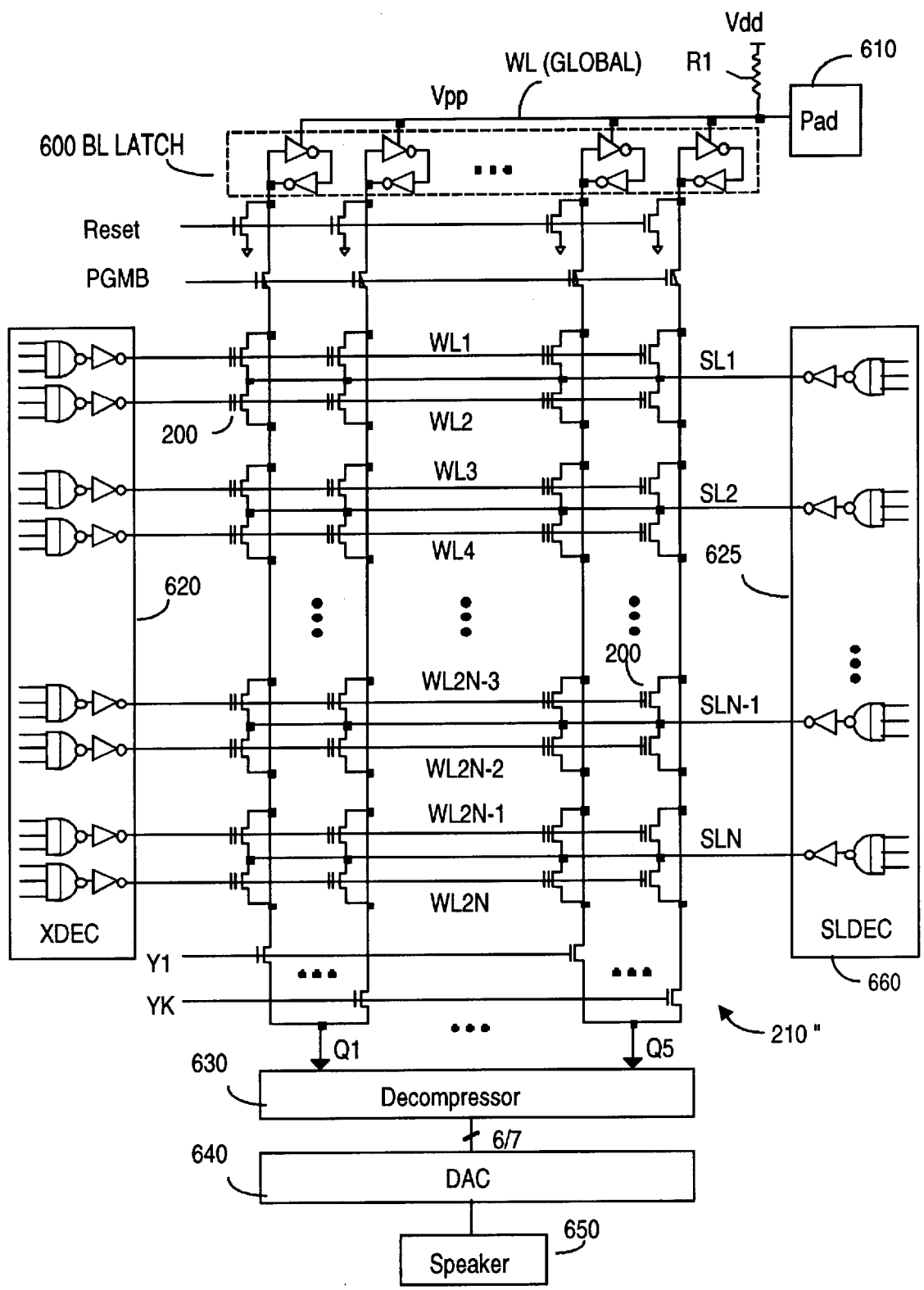
FIG. 8B depicts an exemplary NOR-type array used in an audio application, implemented according to the present invention.

In erasing the entire array of FIG. 8B, 5V is coupled to all SLs, all BLs are grounded, and all WLs preferably are coupled to a two-step voltage that is 1V in a first step and 0V in a second step (by way of example). However, granularity of the WL voltage steps may provide more than two levels of potential. In this embodiment, hot holes are injected from the source region to the floating gate, which decreases Vt for the cell.

In the embodiment of FIG. 8B, each SL is shared by two adjacent WLs, and each SL (SL1 . . . SLN) is separated from each other. If a SL decoder (660) is added, a selected SL can be coupled to 5V, while deselected SLs are coupled to ground. The two WLs coupled to selected SL will be erased by hot-hole injection.

The resultant structure thus provides small size erasure (e.g., 128 WLs) instead of conventional large size erasure (e.g., 64KB) as is the case for conventional flash memory. Further, by adding latches to the SL decoder, as few as 2 WLs to many WLs to indeed the entire array may be simultaneously erased. Understandably, such structure provides much higher flexibility than conventional flash memory.

Because the cells in the array of FIG. 8B may be programmed as the same manner used for conventional flash memory, approximately 5V is coupled to selected BLs, while deselected BLs are grounded. A "high" potential of perhaps 5V is coupled to the selected WL, while deselected WLs are grounded, e.g., at "low" potential. All SLs are grounded. As a result, selected memory cells will conduct large channel current due to the high gate and drain potentials. Hot-electrons are thus induced and injected from drain region to the floating gate, which increases Vt for the selected cells. It will be appreciated that the present invention permits programming with low voltage potential, e.g., perhaps about 5V, because Vt is only about 3V (as opposed to, say, 6V). If there is a requirement for a high Vt application, e.g., Vt>|5V|, then high potential for selected WLs will be about 8V.

Typically, programming is done on a per byte basis because the large channel current prohibits simultaneously programming a large number of cells. However, more than one byte of cells may be simultaneously programmed providing the power supply can provide the required current, e.g., about 5 mA/byte.

NOR-type flash memory, like NAND-type, can be used as typical flash memory, as an EPROM replacement, as well as OTP memory. For EPROM replacement and OTP applications, programming may be carried out at the user-site with programming voltage being provided by external writers to permit a large number of cells to be simultaneously programmed. Thus, in the embodiment shown in FIG. 8B, selected WL cells are programmed simultaneously. Data is first input and latched into the BL latches before programming the selected WL. The BL latches then provide 5V to the selected BLs and 0V to the deselected WLs, according to the input data, e.g., the input data determines the BL latch values. The Vpp line, coupled to Vpp pad 610, may provide 5V to the latches. An external writer unit that can supply sufficiently large current is coupled to the Vpp pad.

Although the exemplary embodiment of FIG. 8B depicts single WL programming, of course a smaller number of BL latches may be used to simultaneously program a smaller number of cells. In the example shown, cell Vt is erased to 0.5V using hot-hole injection, and is programmed to 2V–3V using CHE with a WL potential of about 5V. This embodiment permits low Vcc potential (e.g. 1.8V) to be directly coupled to the cells for reading.

Reset operation of the BL latches, isolation of the BL latches, and the function of the de-compressor, DAC, and speaker may all function as in the above-described NAND-type flash memory. Those skilled in the relevant art will appreciate that the various potential levels cited throughout this application, including Vcc, Vpp, Vt, are exemplary, and are not intended to limit the scope of the present invention.

A detailed description of serial programming will now be given. During read operation, external Vpp is removed, which pulls the power line of the BL latches up to Vdd (e.g., 2.4V) due to a weak pull-up device, e.g., resistor R1 shown in FIG. 8, although other pull-up devices could instead be used. The PGMB signal goes "low", e.g., ground, to isolate the BL latches from the BLs. Thus the BL latches are enabled in programming but are disabled in read operation.

To read data, a selected WL is accessed and a Y-decoder selects selected BLs, which are then coupled to sense amplifiers in conventional fashion. Alternatively, FIG. 8 depicts a special architecture especially useful for serial applications such as recording and playing back speech.

Such applications often use a compression algorithm, e.g. APCM, to reduce storage requirements, e.g., by compressing 8-bit data into 5-bit data. Thus, such applications require a decompress mechanism (e.g., 630 in FIG. 8) to expand cell data from 5-bit to either 6-, 7-, or 8-bit for playback, depending upon the desired resolution. The digital data is sent to a digital-to-analog-converter (DAC) (e.g., 640 in FIG. 8) for conversion into an analog signal that is coupled to a speaker 650 or other device for playback. However this particular application is but one of many with which the present invention may be practiced.

Figure 9:
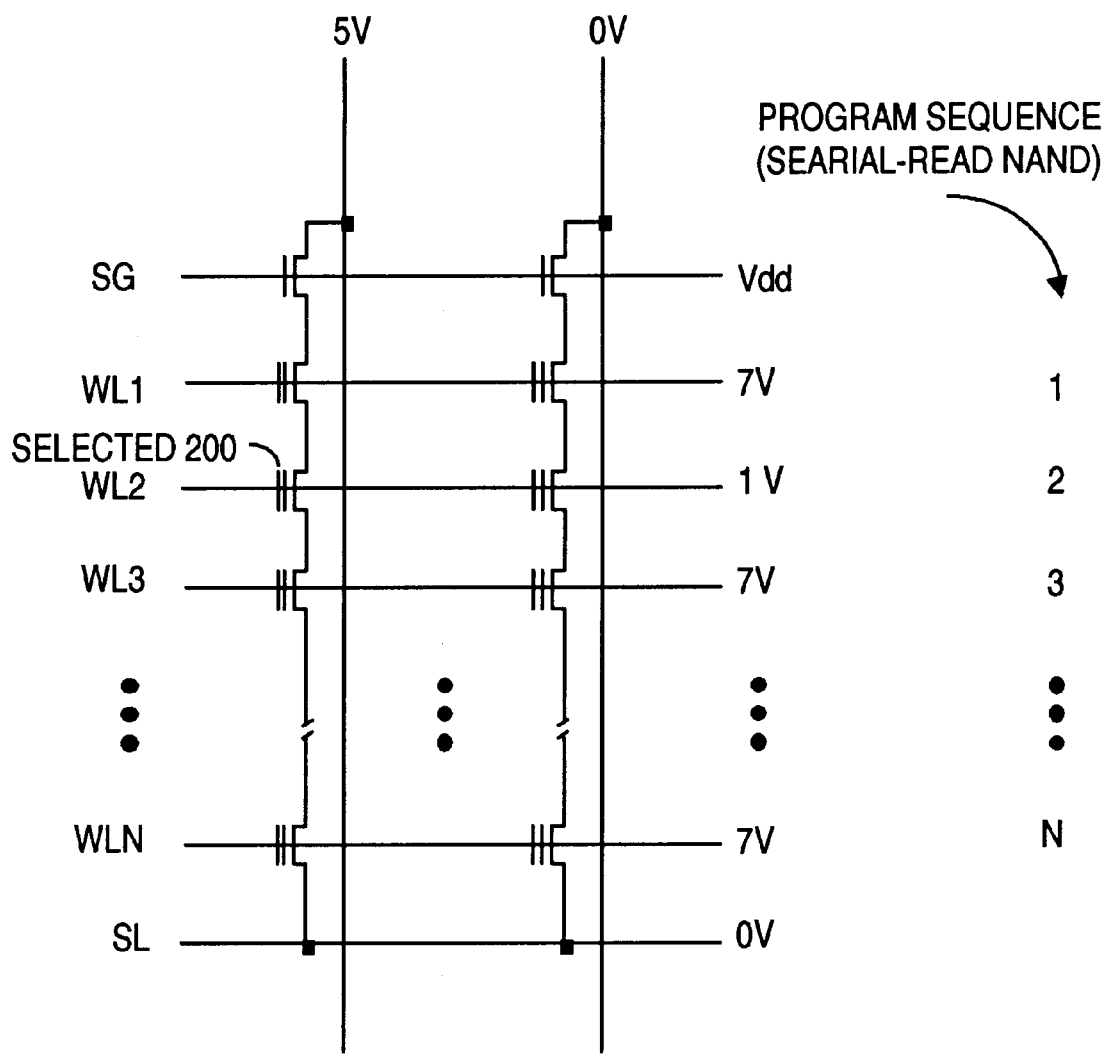
FIG. 9 depicts an exemplary implementation of hot-hole injection programming in a serially-read NAND-type array, according to the present invention.

FIG. 9 exemplifies a serial programming sequence using hot-hole injection programming on a serially-read NAND array, according to the present invention. In this embodiment, pulses of about 5V are coupled to the SL, and first and second step 1V and 0V potentials are coupled to the WL of the selected cell 200. During the first WL step, the applied WL potential decreases cell Vt from 2V or more to about 1V. During the second WL step, Vt further decreases to about 0V. Deselected WLs and the select gate (SG) are coupled to about 7V, to pass the 5V programming voltage to the source, and BL voltages to the drain of the selected cell.

Programmed data is determined by the BL voltages seen by the selected and deselected BLs. Select BL potential preferably is 0V and deselected BL potential is about Vdd, according to the BL latch data. According to the present invention, hot-hole injection occurs in the source region of the selected cell as a result of the electric field induced by the approximately 5V Vds potential. But no hot-hole injection occurs for deselected cells, for which sub-threshold leakage of sufficient magnitude to induce such injection does not occur.

Figure 4B:
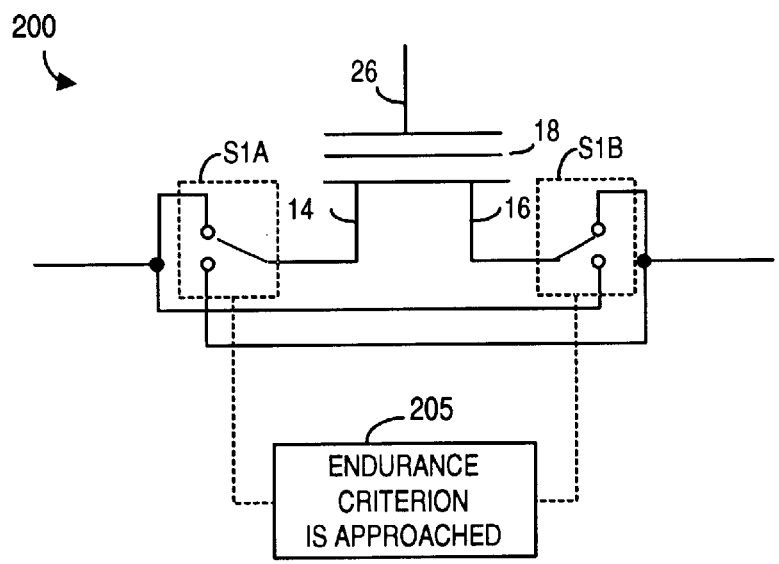
FIG. 4B depicts endurance enhancement using a storage cell such as depicted in FIG. 4A.

Of course because cell 200 is symmetrical (see FIG. 4A), voltages coupled to source and drain regions may in fact be reversed in another application, thus effectively doubling cell endurance lifetime. FIG. 4B depicts, generically, swapping of source and drain regions using switches S1A, S1B when approaching unacceptable endurance is detected by a test procedure or mechanism 205. As noted, when using HHI to erase from the drain node, preferably Vd>5V, Vg=Vs=0V. If HHI erasing is to occur from the source node, then Vs>5V, Vg=Vd=0V. Since cell 200 has functionally symmetrical drain and source regions, it matters not which region is used as the erase node.

Under normal conditions, one of two bias conditions is needed to HHI-erase data from a flash memory cell, which is to say, to decrease cell Vt. If source-node HHI erase is to occur, e.g., tunnel current flow will be from poly1 floating gate 18 to N+ junction drain region 16. In this mode, Vds channel current will flow from source region 14 (preferably biased to be greater than about 5V) to drain region 16 (biased to 0V). The control gate 26 will be at 0V. On the other hand, if drain-node HHI is to occur, tunnel current will flow between poly1-gate 18 and N+ source junction 14. In this erase mode, source node voltage and control gate 26 voltage are each 0V, and drain node 16 voltage is greater than about 5V.

It will be appreciated that one can adjust drain potential for cell 200 to accomodate different values of Vt, to bring about HHI erasing. For example, increasing BL (drain) potential will increase poly1-gate (floating gate) potential through capacitive coupling from drain to poly1. On the other hand, the poly1-gate potential may be increased by coupling from the poly2 WL (control gate) potential. Elevated poly1-gate potential implies higher WL or higher BL potential. Where the poly1-gate potential is higher, the higher cell-Vt may be reduced to induce HHI erasing by varying BL potential. By way of example, if cell 200 has a cell Vt of about 1V (a Vt value that is less than the typically 2V UV-erased Vt), the 1V cell Vt may be decreased to say 0.5V using 5V BL potential and 0V WL potential.

On the other hand, the cell Vt might be higher than UV-erased Vt, e.g., cell Vt might be 2.5V. In this instance, the poly1-gate will have excess electrons that will still bias the floating gate negatively. The result is that HHI will not be induced, and cell-Vt will not be reduced. Essentially, the negative potential on the floating gate turns-off the poly1 MOS device completely, and no drain-source sub-threshold leakage results. Again, HHI is induced when the poly1-gate potential is less than about 1V, but is greater than about 0.5V. The absence of electrons on the poly1 floating gate is readily discerned. When cell Vt equals UV-erased Vt, there are effectively no electrons on the poly1 floating gate. If cell Vt exceeds UV-erased Vt, then the poly1 floating gate will have some electrons. However, when cell Vt is less than UV-erased Vt, there will be holes present at the poly1 floating gate.

Thus, when cell Vt exceeds UV-erased Vt, the poly1 floating gate is negative, and no HHI erasing will be induced. But drain potential or control gate potential may be increased to bring the poly1-gate potential to a value between 0V and about 1V, with the result that HHI can be induced. Stated differently, according to the present invention, cell Vt can be reduced by increasing BL potential or by increasing WL potential, even if cell Vt is greater than UV-erased Vt. This permits the present invention to attain HHI erasure by compensating for an unexpectedly high cell Vt by using higher WL or BL potentials. As a result, fabrication tolerances associated with ensuring a given magnitude Vt for memory cells 200 may be somewhat relaxed.

Circuit block 205 determines when endurance data indicates drain and source regions should be swapped. When such determination is made, switches S1A, S1B are switched into the opposite position, e.g., "down" in FIG. 4B. It is understood that FIG. 4B is generic and that mechanical switches would not normally be used. Solid state switches may of course be implemented with MOS or CMOS devices. Alternatively, it suffices if the potentials coupled to source and drain regions once a swap is to be made are essentially the potentials that would have been coupled respectively to drain and source regions before swapping the roles of these functionally symmetrical regions.

In practice, some memory cells within a memory array may begin to fail or marginally function at normal programming and erase regimes, while other memory cells in the array program and erase normally with the same bias regimes. The deterioration of cells due to endurance stress can manifest itself bit-by-bit, wafer die-by-die, and indeed wafer-by-wafer.

Thus, preferably circuit block 205 represents erase verification and program verification circuitry, which circuitry is known in the art. Once such verifications start to fail, for example as evidenced by an excessive number of required programming cycles, block 205 will cause the effective switches S1A, S1B to change states for such cells. Block 205 will communicate with source and drain decoders associated with the questionable memory cells 200, and on a bit-by-bit basis, those cells will have the roles of their drain and source regions reversed.

Thus, some cells 200 within an array may have their source and drain regions swapped while other, more reliable, cells in the array continue to function acceptably without yet swapping source and drain regions. In either event, the result is enhanced endurance lifetime for individual cells, and thus collectively for an array of such cells. This bit-by-bit approach is preferred to other approaches such as fabricated test memory cells in the array and monitoring such cells for evidence of onset of endurance failure, and then globally swapping drain and source regions for all cells in the array. The bit-by-bit approach is also preferred to a procedure in which a running count of an average number of programming cycles is maintained for the array, and when a predetermined number of cycles is attained, globally swapping all source and drain functions.

The ability of the present invention to extend, perhaps double, endurance lifetime by selectively swapping source and drain regions for problematic cells when endurance problems seem at hand may be practiced with both NOR-type and NAND-type arrays (see FIGS. 8A and 8B).

By way of example, consider a NOR-type array such as that shown in FIG. 8B, and assume that Vt<UV-erased Vt. Erasure of cell 200 is accomplished by coupling control gate and source of the selected cell to ground, and coupling the drain to 5V. The 5V drain potential may be provided by a Y-decoder (e.g., perhaps part of address logic 120, see FIG. 1), with selected SLs being grounded. The resultant HHI will occur in the drain region.

Assume that such a configuration has been used sufficiently long that drain region endurance problems seem likely to occur in the not too distant future (as predicted by method/mechanism 205 in FIG. 4A). Effectively, "switches S1A and S1B" in FIG. 4A may now be "switched" by now applying 5V to the source, and grounding the drain and control gate. Selected SLs will be coupled to 5V but deselected SLs will be grounded. With potentials so applied, HHI will now occur at the source region. Thus, the source region will now be subjected to HHI, and is essentially uninfluenced by the history of past HHI at the drain region. The result of the effecting "switching" or "swapping" of drain and source is that cell endurance lifetime is extended, perhaps as much as doubled.

Because NAND-type flash memory is typically used in serial-read applications, FIG. 9 also depicts a programming sequence used for such applications, e.g., from top WL to the bottom WL. As noted, the flowchart of FIGS. 7A–7B depicts a complete erase/program sequence appropriate for the serial-type NAND flash memory. shown in FIG. 9. The entire array of cells 200 preferably is erased under exposure of UV light, which forces all cell Vt potentials to an intrinsic state. The UV-erased value of Vt is typically about 2V, but is dependant upon cell fabrication technology and dopant implant concentration. After completely erasing data from the entire cell array, the array is programmed with input data. As each BL is provided with a BL latch to store input data, an entire WL can advantageously be programmed simultaneously. For serial read applications, the data is programmed to the array in serial, e.g., input data for the first WL is latched and programmed.

After the entire WL successfully passes program-verification, step 480 in FIG. 7B, a counter will increment the next WL address (see FIG. 7B, step 500), whereupon data for that next WL is input and latched into the BL latches, and this data is programmed upon the next WL. This program-verify-increment WL cycle preferably is repeated until all the WLs are programmed. Of course, while FIGS. 7A–7B describe a top-to-bottom WL serial programming sequence, a reverse bottom-to-top WL programming sequence could instead be used. In either WL programming sequence, read operation preferably is carried out in the same sequence.

Selected WL programming will now be described. BL voltages are applied according to the data in the BL latches. Hole injection us used to program cell data by varying cell Vt, preferably according to a two-step procedure.

In a first step, a first potential is coupled to the selected WL, e.g., perhaps 1V, and programming pulses of perhaps 5V magnitude are coupled to the selected BL. After each programming pulse, a program-verification step is performed to verify data in the programmed cells. Setup of the verification may be similar to a normal read operation except that about 1.5V is coupled to selected WLs. If program verification indicates that data in any programmed cell remains at a high-Vt state, an additional programming pulse is applied to that cell, and the program-verification cycle is repeated until all programmed data is at a low-Vt state. When that occurs, Vt for all selected cells will be less than the verification potential of about 1.5V.

Upon completion of the first programming step, a second programming step is carried out in similar fashion except that the verification voltage will be reduced down to 0.5V instead of 1.5V. After all programmed cells pass verification of the second programming step, Vt for the selected cells will be <0.5V and WL programming is complete.

The ability of symmetrical flash cell 200 to be programmed converting source to drain and drain to source will now be described. The difficulty in the prior art of hole trapping in the thin gate oxide of a memory cell has been described earlier herein. Sooner or later, the endurance limitation of any memory cell will be attained. When such limit is reached with prior art memory cells, the memory array can no longer be used. In prior art flash memory cells, programming can only be accomplished from the drain region, due to the cell asymmetry (see FIG. 2).

But by contrast, when the endurance limitation is approached with memory cells according to the present invention, the symmetrical source and drain regions are interchanged, and programming can henceforth be accomplished from what was the source region but will now be regarded as the drain region. Such duality results from a symmetrical source-drain topography that permits programming to be converted from the drain region to the source region once drain region hole-trapping occurs. As a result, effective lifetime of symmetrical flash cells according to the present invention can be approximately doubled.

Figure 10:
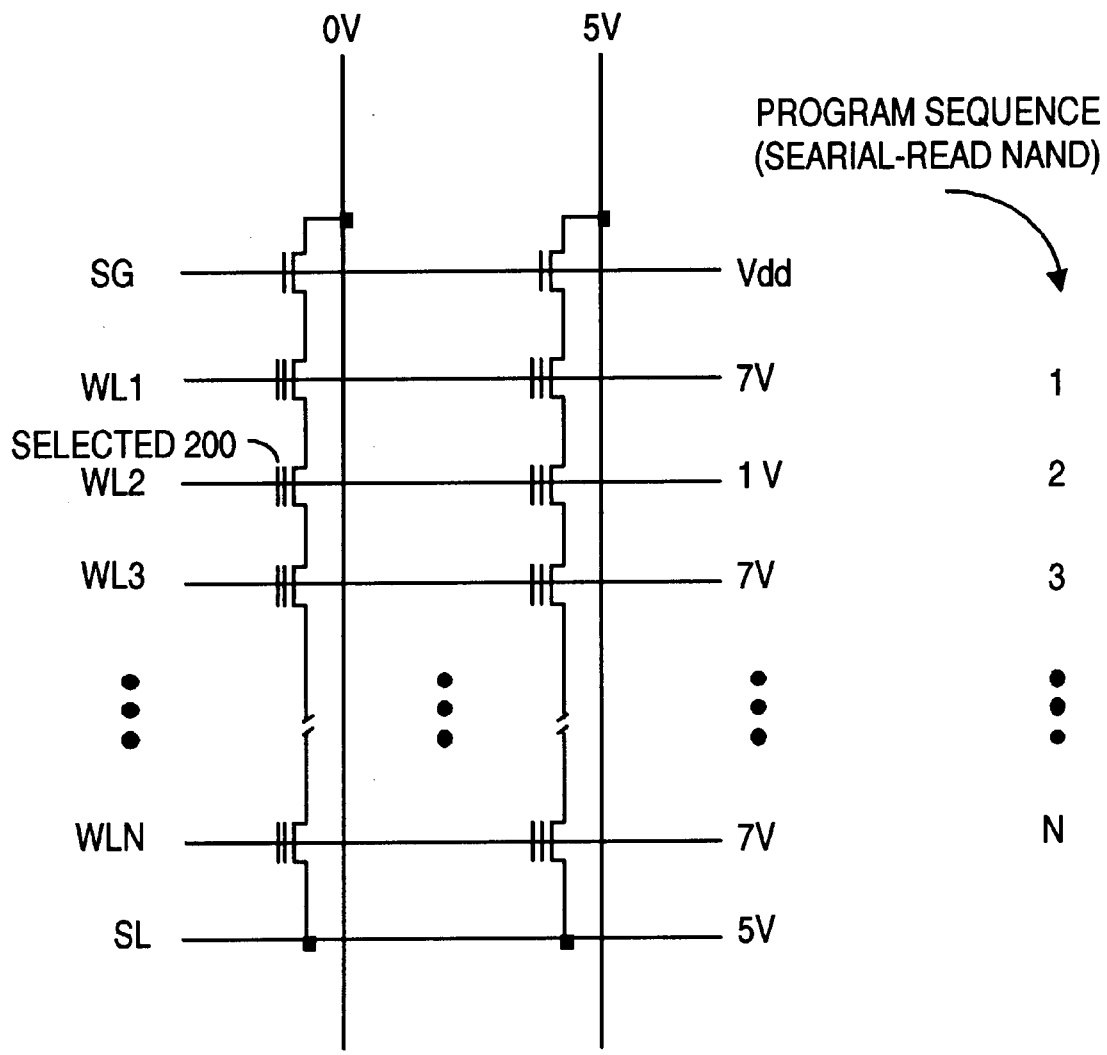
FIG. 10 depicts an exemplary programming regime for a symmetrical topography NAND-type flash, after converting source/drain regions, according to the present invention.

FIG. 10 depicts an exemplary programming regime for a symmetrical topography NAND-type flash, according to the present invention, after converting the source/drain regions. WL potentials remain at the same voltages used before the conversion, but SL potentials are changed. For the horizontal SL of a selected sub-BL, the SL potential is changed from 0V to 5V level, whereas potential for deselected SLs remains at 0V. This bias enables cells on the selected sub-BL to induce source region hot-hole injection.

An alternative embodiment, 5V programming voltage could be applied to all SLs simultaneously to eliminate a need for a SL decoder. But cells in deselected sub-BLs would then experience SL stress, which is not desirable. Yet another embodiment could provide a select transistor to the source side of each sub-BL. Since only the select transistor of the selected sub-BL would be turned-on (and other select transistors would be turned-off), the SL could be eliminated and a common SL employed.

Somewhat similar to programming in the original configuration, controlling BL potentials enables bit-selectivity. Ground (0V) is coupled to selected BLs, with 5V coupled to deselected BLs. This is the reverse of the biasing described in the previous paragraphs.

Selected cells have their source coupled to 5V, and their drain coupled to 0V, a configuration that induces source region hole-injection programming. By contrast, source and drain regions for deselected cells are coupled to 5V, a bias condition that precludes sub-threshold current flow. Stated differently, only selected cells that conduct sub-threshold leakage current will be erased to a lower Vt. If it is desired to apply reversed BL potential (as in the original configuration) then the input data is reversed before it is latched into the BL latches.

Thus far the present invention has been described with respect to storing binary data in a flash memory cell, e.g., one-bit of stored data distinguished by two levels of Vt. Conventional random access memories ("RAM") such as SRAM and DRAM only store binary data. Alternative embodiments that extend the invention to multiple-level-cells ("MLC"), e.g., flash memory cells that can store more than two levels of data, will now be described.

Hot-hole injection may also be used to program multiple-level memory cells ("MLC"), which are flash memory cells that can store more than two levels of data, which is to say, storing more than one digital bit per cell. The multiple data states are stored in the MLC as a function of the charge stored on the floating gate. But unless the Vt distribution for each level of storage can be sufficiently tightly controlled, the different stored levels can not readily be distinguished. Stated differently, an MLC is a cell that can store multiple Vt levels. For an MLC to store N-bits per cell requires storing 2N levels of Vt. Because HHI uses low voltage to program selected cells, and indeed current is lowered as the cell is programmed in a sub-threshold regime, NOR-type and NAND-type MLC flash memory arrays may be implemented, as will now be described.

The ability to programmably store multiple N-bits in a single cell increases the storage density of the IC chip area by a factor of N, and drastically reduces the manufacturing cost. As will now be described, MLC flash memories and EEPROM may be implemented according to the present invention.

HHI is specially suitable for MLC as it can control Vt for the programmed cell exceedingly well because HHI programming tends to converge final Vt in the cell within a narrow distribution. The converged Vt is strongly related to the gate voltage applied to the cell. Therefore, programming different values of Vt is readily controlled by applying different control gate potential to the MLC, to converge Vt to different values according to the input data.

Two embodiments for storing multiple-level Vt in a single MLC will now be described. In the first embodiment, all Vt levels are positive, preferably between 0V and the magnitude of UV-erased Vt, perhaps 2V. In the second embodiment, Vt levels may extend negatively, preferably between a negative voltage and the UV-erased Vt. The second embodiment thus extends the range of Vt levels, which increases the number of bits (N) storable in one cell. However, the second embodiment is limited to NAND-type array configurations, whereas the first embodiment (Vt≧0V) can be used for NAND and NOR type arrays.

Figure 11:
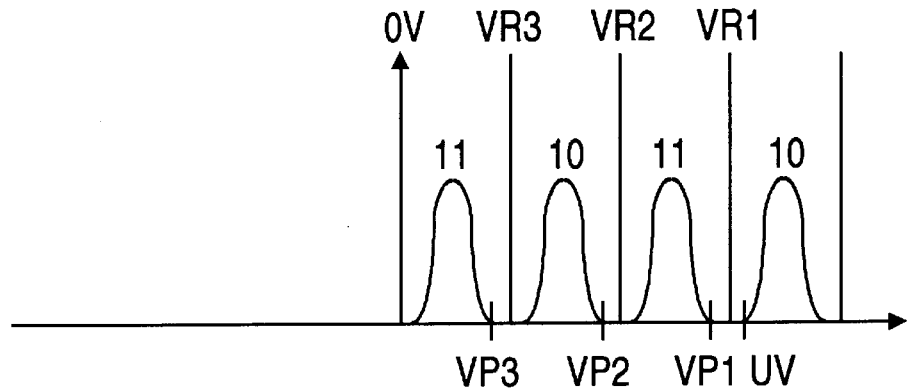
FIG. 11 depicts positive Vt distribution suitable for programming a four-level multiple level cell, according to the present invention.

The first (Vt≧0V) embodiment of Vt distribution will now be described with respect to FIG. 11. FIG. 11 depicts an exemplary Vt distribution for a four-level MLC, in which a single cell stores up to two-bits of data: 00, 01, 10, 11. In practice, the MLC is UV-erased to hold data 00. The cell is then programmed and verified to be VP1, VP2, or VP3 using HHI, to represent data 11, 10, and 01, respectively. Because Vt levels lie between 0V and UV-erased Vt (about 2V for present technology), one can readily allow additional Vt levels by increasing the UV-erased Vt, for example by increasing the MLC cell implant dose during fabrication.

To program the MLC, the selected cell's drain is coupled to a middle-high potential such as 5V, which is used to program binary cells. HHI programming results in saturation at a steady-state voltage where concentrations of hot-hole injections and hot-electron injections are in equilibrium. This phenomenon can be used to provide the requisite tightly control Vt to program an MLC cell.

When programming four-level cells, a first voltage is coupled to the control gate to program the cell to a first Vt. The MLC is then programmed to the second and the third Vt by applying second and the third gate voltages, respectively. For a UV-erased Vt of 2V, a control gate voltage of 0V will converge cell Vt to approximately 0.25V, which can represent stored data 11, as all gate potentials in this embodiment are positive.

Figure 12:
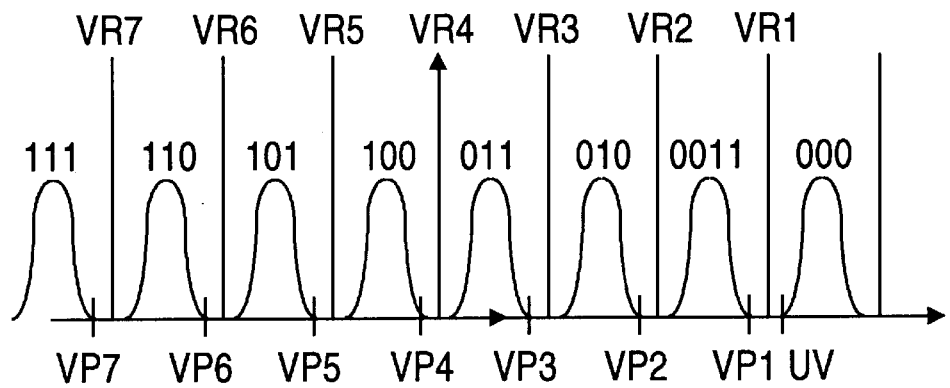
FIGS. 12 and 13 depict positive and negative Vt distributions, suitable for programming multiple level storage cells, according to the present invention.

The second embodiment provides a wider cell Vt distribution, in that at the lower end, Vt may now be negative, and at the higher end, Vt is positive. FIG. 12 shows an exemplary Vt distribution for an eight-level MLC, in which four positive and four negative levels of Vt are shown. The use of negative and well as positive vt potentials permits a doubling of Vt levels that can be stored in the cell, compared to the use of only positive Vt levels. Thus, this embodiment permits storing $2^3$ or three bits per cell. Initially, cell Vt preferably is UV-erased to data 00, as in the first described embodiment. The cell is then programmed and verified to be VP1, VP2, . . . VP7, which levels respectively represent stored 001, 010, . . . , 111.

Programming with positive and negative Vt values restricts this second embodiment to use with NAND-type arrays only. NOR-type arrays cannot be used with negative Vt as all deselected cells must be turned off to sense current flow in the selected cell. But if the deselected cell has negative VT, it cannot be turned off by the typically 0V deselected gate voltage. As a result, even a deselected cell will conduct channel current that will contribute a sense error in reading current for the selected cell.

However, negative Vt is allowed for NAND-type arrays as each deselected sub-BL is isolated from the main-BL by select transistor. Thus cells on the deselected sub-BLs cannot affect current reading of the selected cell. For selected sub-BL, all deselected cells will originally have been turned on, and thus negative Vt is permitted. To summarize, NAND-type arrays have wider Vt distribution that can span negative to positive potential. This increased Vt distribution increases the number of Vt levels that can be stored in a single cell, thus increases per cell data bit storage.

To achieve negative Vt, HHI will require negative control gate voltage, and thus the converged steady-state potential can be negative. Triple-well fabrication technology is used to provide negative gate voltage. In such fabrication, the third well is a P-well disposed within a deep N-well. The negative Vt NMOS devices are formed within the P-well, which is coupled to a negative well voltage to prevent forward current from substrate to junction.

Figure 13:
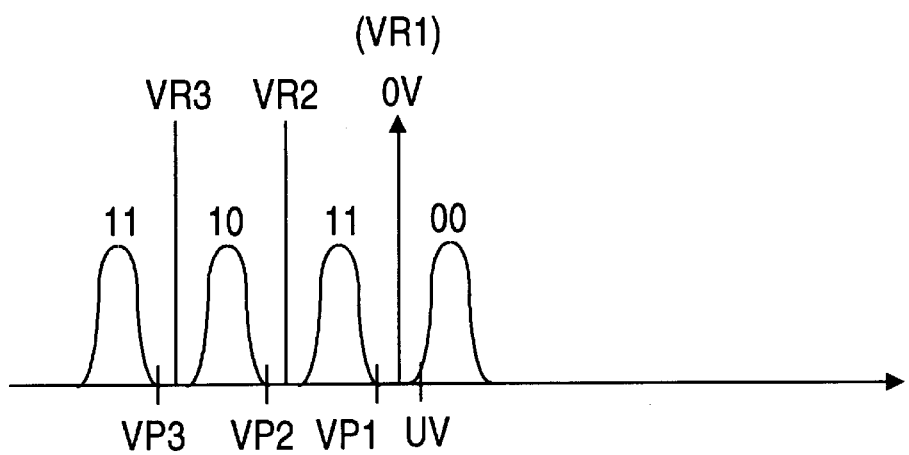

FIG. 13 depicts a modification of the second embodiment, which used positive and negative Vt programming. As described earlier herein, a cell erased with UV will have a UV-erased Vt of perhaps 2V that may be decreased to perhaps 0.5V. This decrease in Vt reduces the voltage needed for deselected cells in passing BL programming voltage to the selected cell. In such applications, the positive Vt may have only one level, shown in FIG. 13 as the UV-erased Vt representing stored data 00. All other Vt levels in FIG. 13 are negative, representing stored data values 01, 10, 11.

To implement negative Vt, the hot-hole-injection requires negative gate voltage, thus the converged steady-state can be negative. To provide negative gate voltage, triple-well technology has to be used in fabrication. The third well is a P-well located within a deep N-well. The negative NMOS devices are located within the P-well, and the P-well is applied with a negative voltage to prevent forward current from the substrate to the junction.

Programming operations for MLCs will now be described with respect to practical considerations. For UV-erased applications (including OTP and EPROM replacement), programming operations will be carried out in-house. Thus, the multiple control gate programming voltages, positive or negative, may be provided from a programming unit, or writer. This reduces memory cost, as there is no need for on-chip programming control circuity. Although program verification may also be externally controlled to save IC chip area, on-chip verification control circuitry is preferred. Such on-chip verification circuitry may be combined with the read circuitry to improve tracking between Vt for the programmed cell and the read voltage.

For non-UV-erased applications, data are erased and re-programmed on-chip, which means the programming control circuitry is embedded. For an embodiment using all positive Vt distributions, the various positive programming voltages may be obtained by dividing down a common positive potentia. For positive-negative VT distribution embodiments, an on-chip negative pump circuit (e.g., pump 240, FIG. 5) is activated during programming operation, and a divider is used to provide the required multiple programming voltages.

Alternative embodiments for reading MLC arrays will now be described. For ease of reference, the first embodiment will be termed "stepwise-gate" and the second embodiment will be termed "fixed-gate". The stepwise-gate embodiment provides a sequence of gate voltages to the selected MLC cell to determine cell Vt.

With reference to FIG. 11, if one wished to read a four-level MLC cell, three control gate potentials VR1, VR2, and VR3 are applied to control gate 26 of MLC cell 200 (e.g., see FIG. 4A). More preferably, the sequence of applied voltages is reversed to be VR3, VR2, and then VR1.

If Vt for MLC 200 is second level (data 10), e.g., intermediate to VR1 and VR2, when VR1 is applied, the drain-source channel will be off, and cell channel current will sub-pA range. By contrast, with VR2 applied, the drain-source channel will be on, and cell channel current will be in the μA range. The level of the data stored in the MLC is distinguished from the difference in channel current, which is detected with a sense amplifier using detection circuitry well known to those skilled in the relevant art. Preferably cell Vt is programmed and verified to be VP1–VP3, to maintain a reasonable margin between verify voltages and read voltages VR1–VR3.

Note that for all-positive Vt cell distribution, VR1–VR3 are all positive and may be directly voltage-divided and generated from Vdd. For a positive-negative Vt distribution (see FIG. 12), in addition to positive VR1–VR3 potentials for reading data 000–011, negative potentials VR4–VR7 are required to read the cell data 100–111. Thus, an on-chip negative pump circuit such as unit 240 in FIG. 5 will be used in read operation to generate the negative potential.

If the spread of Vt levels is increased by increasing the UV-erased Vt level, if may be necessary to use on-chip pump 230 (or equivalent) to generate the positive read potential, should the required potential exceed the available Vdd voltage source.

Read voltages applied to NOR-type and NAND-type arrays are different. For NOR-type arrays, all deselected WLs typically receive 0V to turn off deselected cells. Only the selected WL will receive the stepwise voltages. But in NAND-type array, all deselected WLs receive a voltage higher than the erased-state Vt, which preferably is an UV-erased Vt in the present invention. Only the select transistor of the selected sub-BL is turned-on. Select transistors for deselected sub-BLs are turned-off, which isolates deselected sub-BLs from the main-BL.

Figure 14:
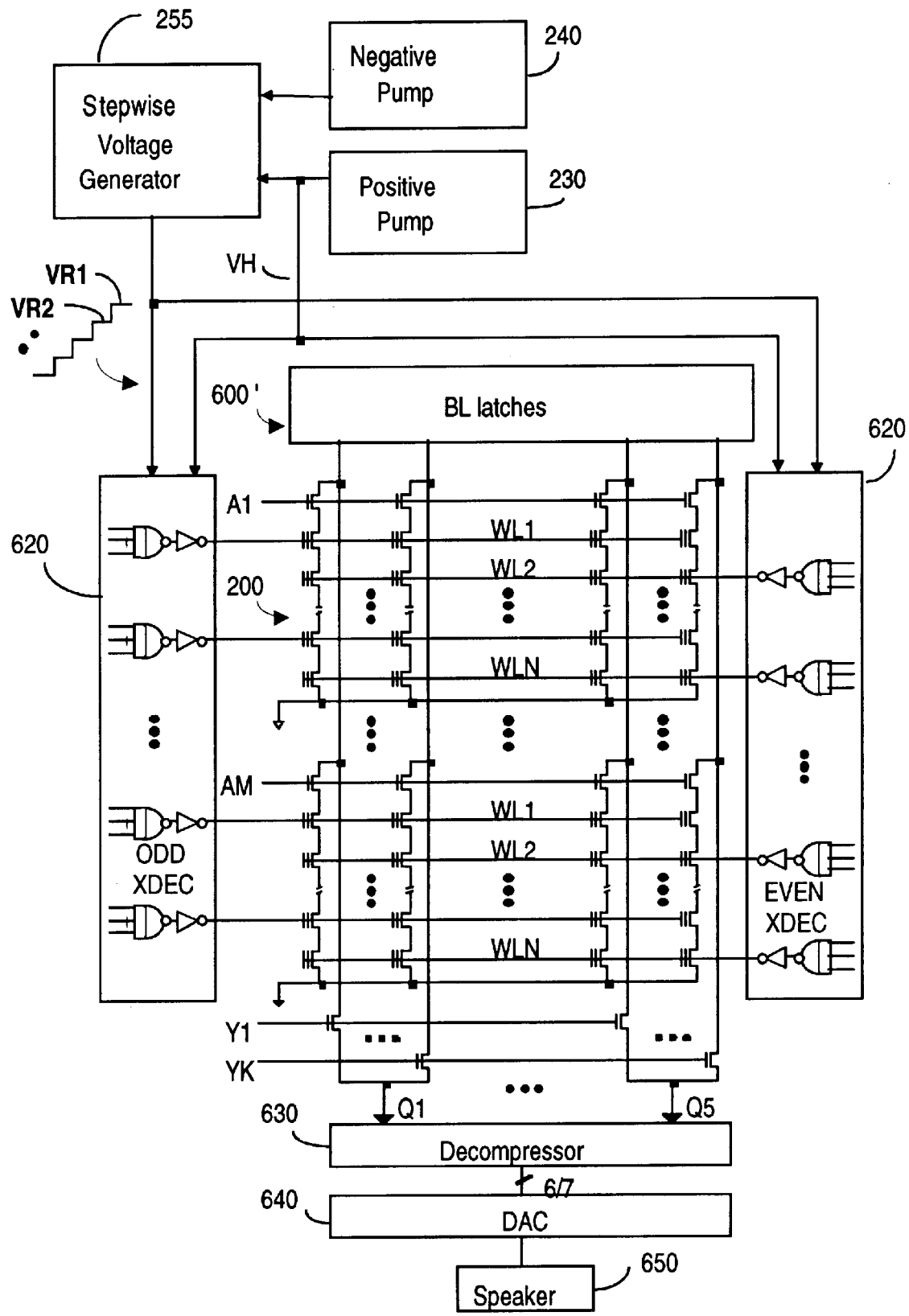
FIG. 14 depicts an on-chip system using step-wise gate potential to read an array of multiple level storage cells, according to the present invention.

FIG. 14 depicts an exemplary implementation of stepwise gate potential to read an MLC. Stepwise voltage generator 255 receives operating potentials from positive pump 230 and negative pump 240, from which potentials it generates stepwise voltages VR1, VR2, . . . , etc. as shown. The stepwise voltage waveform is coupled to X-decoder 620, which provides the stepwise waveform to the selected WL. X-decoder 620 also provides positive voltage (VH) from positive pump 230 to all deselected WLs. Positive potential VH will be higher than the erased-state Vt, while the erased Vt is higher than power source Vdd. If erased Vt<Vdd, then positive pump 230 is not necessary, and power source Vdd may be directly coupled via X-decoder 620 to deselected WLs. While FIG. 14 depicts a NAND-type array of MLC cells 300, a NOR-type array may be implemented with the same circuitry, except that 0V rather than VH or Vdd would be coupled to deselected WLs.

The second embodiment or fixed-gate read operation for an MLC will now be described. Fixed-gate read is often used to read conventional flash memories. A fixed gate voltage, typically Vdd, is coupled to the selected cell, and the difference in cell Vt will produce a change in channel current. The differential channel current is then detected with a sense amplifier to read the state of the binary data held in the cell. This sensing scheme is often referred as "ratio-type" sensing as the cell data is determined from the ratio of cell current and sense amplifier loading.

But when used in an MLC array according to the present invention, fixed-gate read does not produce as substantial a difference in channel current as step-gate read. This diminished read sensitivity occurs because variation in cell Vt does not depend strongly upon off current of less than about 1 μA. Thus, in MLC sensing, on current may be very small (e.g., perhaps ≦5μA), which dictates that the off current should be distinguishably smaller (e.g., perhaps ≦1 μA). These MLC current levels are substantially smaller than conventional binary-state cell sensing, in which the off current may be as small as about 10 μA providing the on-current is perhaps ten times larger, or ≧100 μA.

As a result, fixed-gate read generally requires a reference cell to increase sense amplifier sensitivity. Having to provide a reference cell complicates the problem of tracking reference cell Vt, and degradation of reference cell Vt due to charge loss.

In practice, fixed-gate MLC reading is only useable with NOR-type arrays. This is because in NAND-type arrays, a single sub-BL includes a number of serial cells, and the BL current sensed by a sense amplifier is actually the sum of the effect of all the cells on sub-BL current. The problem is that resistance of deselected cells affects BL current. Further, deselected cells may have various Vts, making it essentially impossible to use reference cells to track current of the selected sub-BL. Thus, the preferred embodiment of MLC read will use a NAND-type array, with stepwise-gate voltages. For NOR-type MLC arrays, the stepwise-gate or fixed-gate voltages may be used.

Table 4 summarizes the above-described preferred implementations of Vt distribution, read modes, and array types, according to the present invention.

TABLE 4

|  | NOR-type array | NAND-type array |
| --- | --- | --- |
| Vt DISTRIBUTION: |  |  |
| Positive | yes | yes |
| Positive and Negative | no | yes |
| READ OPERATION: |  |  |
| Stepwise gate | yes | yes |
| Fixed-gate | yes | no |

In addition to the other embodiments described herein, the present invention permits implementing a special application of NOR-type flash that is useable as multiple-time-programmable ("MTP") EPROM. As has been described herein, applicants' NOR-type flash memory uses HHI for erasing, and CHE for programming. The resultant MTP requires lower voltages than conventional FN-erase type memory, which permits fabricating MTP EPRI+OM using simple process fabrication technology.

An exemplary application will now be described, in which applicants' NOR-type flash is used as one-time-programmable ("OTP") EPROM, or as a special application of MTP EPROM. Because OTP and MTP EPROM according to the present invention do not use UV-erasure, an IC including such memory can be encased in plastic, rather than the more expensive ceramic case with crystal window that would be necessary if UV-erasure were used.

As their names imply, OTP provides only one-time data programming, whereas MTP provides multiple time data re-programming capability. The use of such memory advantageously can reduce product development because data stored in the memory can be re-loaded. While UV-eraseable EPROM can also provide a OTP function, the resultant IC package will be more expensive, and indeed UV-erasing can be more cumbersome than HHI erasing. Thus, MTP according to the present invention provides data EPROM-like re-programmability but with an inexpensive OTP-like package.

MTP memory according to the present invention offers the additional benefit of simple process technology. For example, conventional flash memory requires some 20 masks (or more) for fabrication. Further, because conventional flash memory requires high erase voltage (perhaps 10V, see Table 2) two fabrication technologies are required: one for the high erasure voltage and one for the logic circuitry, which typically is low voltage (e.g., 5V for CMOS).

By contrast, OTP or EPROM only requires perhaps 12 masks and does not require high erasure voltage (since UV-light erasure is used). By definition, a OTP/EPROM product needs no reprogramming, and thus may be fabricated in an inexpensive plastic package, as there is no need to provide a more expensive windowed package. The result is a product that can be manufactured less expensively with substantially reduced manufacturing complexity. Alternatively, an MTP emboidment, which also uses low-voltage HHI erasure (rather than conventional high-voltage FN erasure), can be fabricated using only about 12 masks.

A NOR-type flash memory such as depicted in FIG. 8B can provide multiple erasure granularity from 2 WLs, 4 WLs, 6 WLs, etc. up to the entire array. Such embodiments may be implemented without using triple-well IC fabrication, and can benefit from fewer masking steps due to the functional symmetry (e.g., functional interchangability) of source and drain regions.

In one embodiment, the SLs are divided in the horizontal direction, with one SL being shared by two WLs. A SL decoder at one end of the memory array decodes SLs and provides selected SL voltage (about 5V) and deselected SL voltage (ground). All WLs are at ground potential. In this bias regime, selected WLs are erased by HHI that is induced by leakage current resulting from the high voltage (e.g., about 5V) applied to selected SLs.

In an MTP application, data typically is erased in large sub-blocks or in the whole array, as for OTP and EPROM. MTP memory is often used to store system program code, which means NOR-type flash flexible erase size granularity is not required. Thus, the SL decoder can be simplified. The array SLs may be grouped into several large blocks such that the SL decoder provides 5V erase potential to the selected block SL, to erase all data in that block. Of course if erase voltage is provided to more than one block, multiple blocks up to the entire array may be so erased using HHI. If an application does not require block erasing, all array SLs may simultaneously receive the erase potential simultaneously, with the result that the SL decoder is not required.

Alternatively, array architecture may be implemented to erase under BL control, rather than SL control. (Of course, in any embodiment, it is important that over-erasurenot occur.) In a BL control embodiment, the erase potential (e.g., 5V) is coupled to the BLs to induce HHI.

Block-selective erasure may be implemented by dividing BLs into blocks and applying erase potential only to BLs of the selected block. Alternatively, the BLs may be divided into blocks using the Y-decoder, which would select BLs of a block and provide erase potential to the selected BLs. Yet another BL control architecture can use divided SLs and SL decoder to apply erase potential to all BLs in the array, where the SL decoder provides 0V to selected SLs, and 1V to deselected SLs. In this embodiment, the deselected SL 1V potential suppress cell sub-threshold leakage current, which inhibits erasing deselected cells. A fourth BL control architecture uses a divided-BL structure such that select gates of the divided-BLs pass erase voltage only to selected sub-BLs, which permits array erasure on a sub-BL basis. Understandably, this fourth embodiment imposes a size penalty in that each sub-BL requires additional select gatesthis only. Therefore, the array can be erased in basis of sub-BLs. However, this embodiment imposes a size penalty due to additional select gates for each sub-BL, and increased second layer (metal2) main-BL fabrication.

Because erase voltage is not high, e.g., perhaps 5V or so, erase potential may be generated on-chip generated or provided externally. On-chip erase voltage generation would of course allow users to readily erase and re-program data at minimal re-programming cost. HHI occurs for cells in s sub-threshold leakage condition and requires relatively low erase current, approximately 1 $\mu$A per cell. Erasing an exemplary 16 Mbyte memory array implemented as two half array blocks will require 8 mA current to erase one 8 Mbyte block. On-chip charge pump circuitry (e.g., pump 230 in FIG. 5) can readily generate such current. For memory density higher than 16 Mb, the array may be divided into additional sub-blocks, to limiting total erase current to what is available from the on-chip charge pump.

It will be appreciated that erasing and reprogramming a MTP array according to the present invention is advantageous to erasing conventional EPROM. Conventional UV-erasure requires removal from the system for UV-light exposure and for reprogramming using a special writer unit.

Further, MTP arrays, according to the present invention, may be erased in a relatively short time, HHI injection requiring only about 10 ms to erase a cell. By contrast, FN-erasure of a conventional flash memory requires about 15 sec., and UV-erase of conventional EPROM requires about 20 minutes.

The orders of magnitude-lower erase time required for an MTP memory array, according to the present invention, very substantially reduces in-house erasing cost for the MTP. Before shipping of a memory IC, the memory chip is erased during wafer sorting, after which dicing, bonding, and packaging occur. As noted, conventional flash, OTP and EPROM are UV-erased, which can be carried out simultaneously for all dies on an IC wafer. But as applicants' MTP is HHI erased, erasing may be done on a die-basis. MPT erasure can occur bit-by-bit, with repeated erase cycles, as needed to ensure full erasure without over erasing. The present invention does not utilize wafer sort UV-erase, which would result in a perhaps 0.7V Vt-UV, contrasted with a $0V \leq Vt \leq 0.7V$ obtained from HHI. The above-noted short HHI erasing time is important in reducing total erasing time for all dies on a wafer.

The advantages of MTP become even more important as memory density increases. For example, high density on a given sized IC means the floating gate for a given cell is scaled down, which makes it more difficult to expose the floating gate to UV-light, for conventional erasing.

In practice, UV-erasure is degraded such that data for some cells may not be fully erased. By contrast, MTP HHI erasing, according to the present invention, does not have such degradation problems.

Erase methods for NOR-type arrays will now be described for a number of different voltage relationships. Consider first the case where $Vt(0) \leq Vt-UV$, e.g., Vt for a cell storing data 0 is less than about 0.7V. In an architecture in which the memory array is divided but the BLs are not divided, all memory cells can be erased by coupling about 5V to all BLs and 0V to all WLs for part of the array for at least 10 ms. As the BLs are not divided, the 5V BL potential will be applied to the drains of all memory cells. Sub-threshold leakage in all cells results, and Vt will decrease for all cells.

As noted, less than about 1 µA is conducted by each cell, and even half of a 16 MByte array can be supplied with erase voltage and current by an on-chip pump, with further bifurcation of the array being implemented as memory density increases. For the case where Vt(0)≧Vt-UV, it is preferred that a multiple-step gate voltage be used for erasure, as described elsewhere herein.

In some applications if may be desired to erase less than the entire array. In non-divided BL architecture, the de-selected sources in the array will have to be biased up to at least about 1V to ensure no sub-threshold leakage with resultant HHI erasure occurs.

As noted over-erasing memory cells is undesired. Over-erasing may be defined as a cell whose threshold voltage Vt is made negative (Vt<0) during erasure. Applicants' MTP architecture advantageously provides for a self-stop mechanism to prevent over-erasure. In NOR-type memory arrays such as used in MTP applications according to the present invention, if a cell is over-erased, it cannot be turned off with the typically 0V deselect WL potential. The over-erased cell will then conduct and contribute leakage current to the BL, which causes an error in reading current for the selected memory cell. For this reason, conventional stack-gate flash memories cannot lower their erase-verify voltage below 3V. Because conventional FN erasing does not provide a self-stop mechanism, Vt distribution for an over-erased cell will diverge after erasing.

By contrast, HHI erasure results in a cell Vt distribution of about 2V after electrical (HHI) erasing. As a result, a high erase-verify voltage may be used as there is a large Vt margin to protect the cell from from being over-erased. Of course other techniques to prevent over-erasing may be used, including special cell structures. In so-called "split-gate" flash or EEPROM cells, an equivalent enhancement transistor is fabricated in series with the cell. The enhancement transistor prevents BL leakage, even if the cell is over-erased. Understandably, fabricating such special cell structures contributes to larger cell size, which reduces storage density and increases fabrication costs for the array.

Because applicants' MTP memory provides an erase self-stop mechanism, over-erasing does not occur. A MTP device can be fabricating using a very small stack-gate cell, and erase-verify voltage can be substantially lowered in magntiude.

These benefits are attained as HHI erasure tends to self-stop as the erased cell Vt reaches a predictable steady-state. (No such self-stopping is present in conventional devices that are F-N erased.) At steady state in an MTP memory, erased cells attain an equilibrium condition between hot-electron-injection and hot-hole-injection and cell Vt changes no further. The steady-state condition is dependent upon cell gate potential and upon cell UV-erased Vt (which may be adjusted by varying the doseage of cell implant).

For example, for 0V gate potential and 2V UV-erasure Vt, the cell's Vt stops at a steady-state value of about 0.25V. This self-stop property of HHI efficiently and automatically prevents occurrence of over-erased cells.

To summarize, the HHI self-stop erase mechanism afforded MTP memory permits decreasing magnitude of erase-verify voltages. Further, cell Vt distribution tends to be quite narrow as the distribution of various other cells in the array converges to the same steady-state value. Thus, post-erase Vt distribution is rather tight and near ground potential. Read voltage must exceed erased Vt, and since HHI-erased Vt is decreased, the read potential may be scaled down. Decreased read potential advantageously reduces power consumption during read operations, and can produce substantial benefits for multiple level cell ("MLC") embodiments, described elsewhere herein.

Figure 15A:
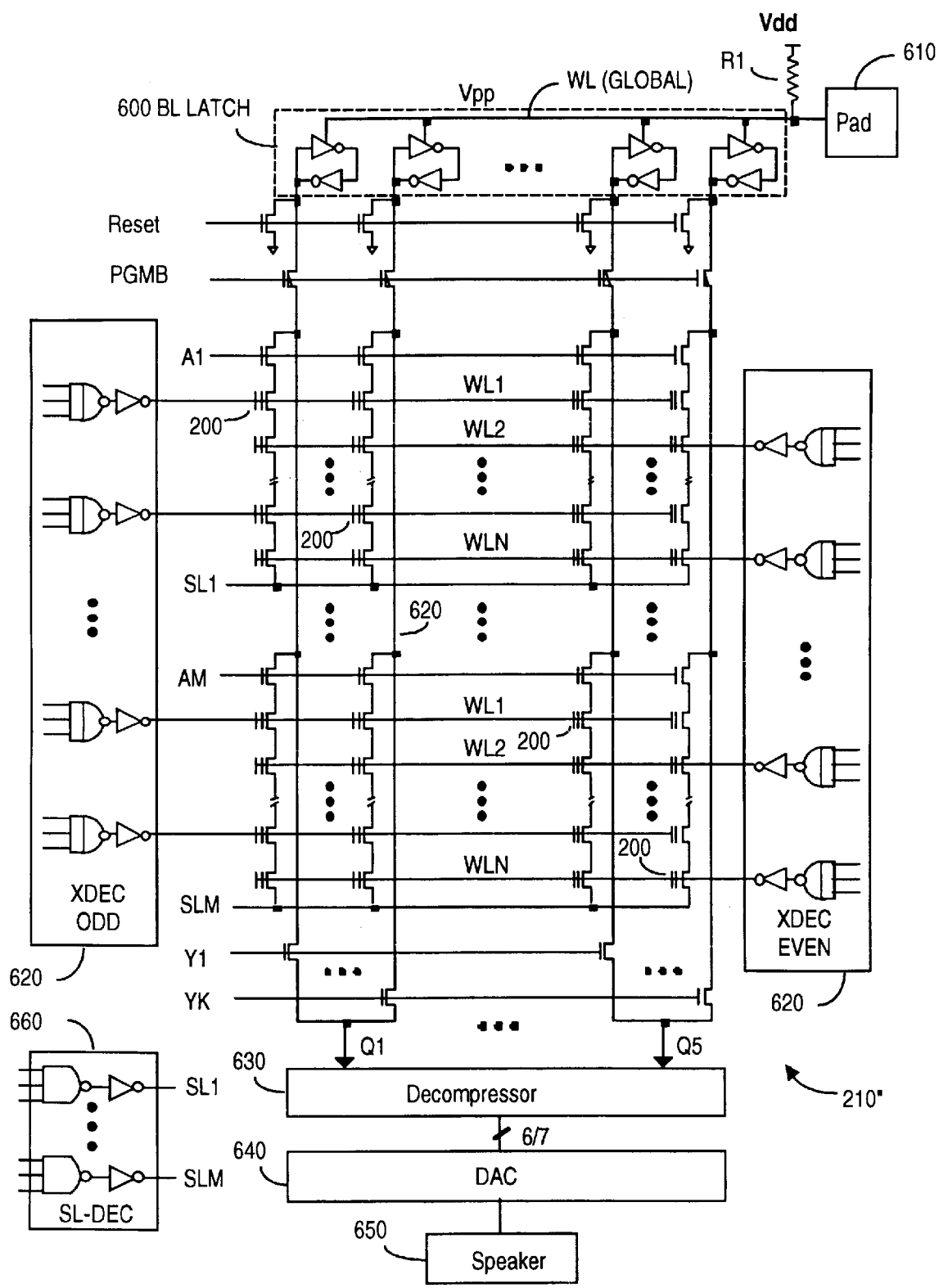
FIGS. 15A and 15B depict respective NAND-type and NOR-type memory arrays in which a source line decoder may be eliminated, according to the present invention.
Figure 15B:
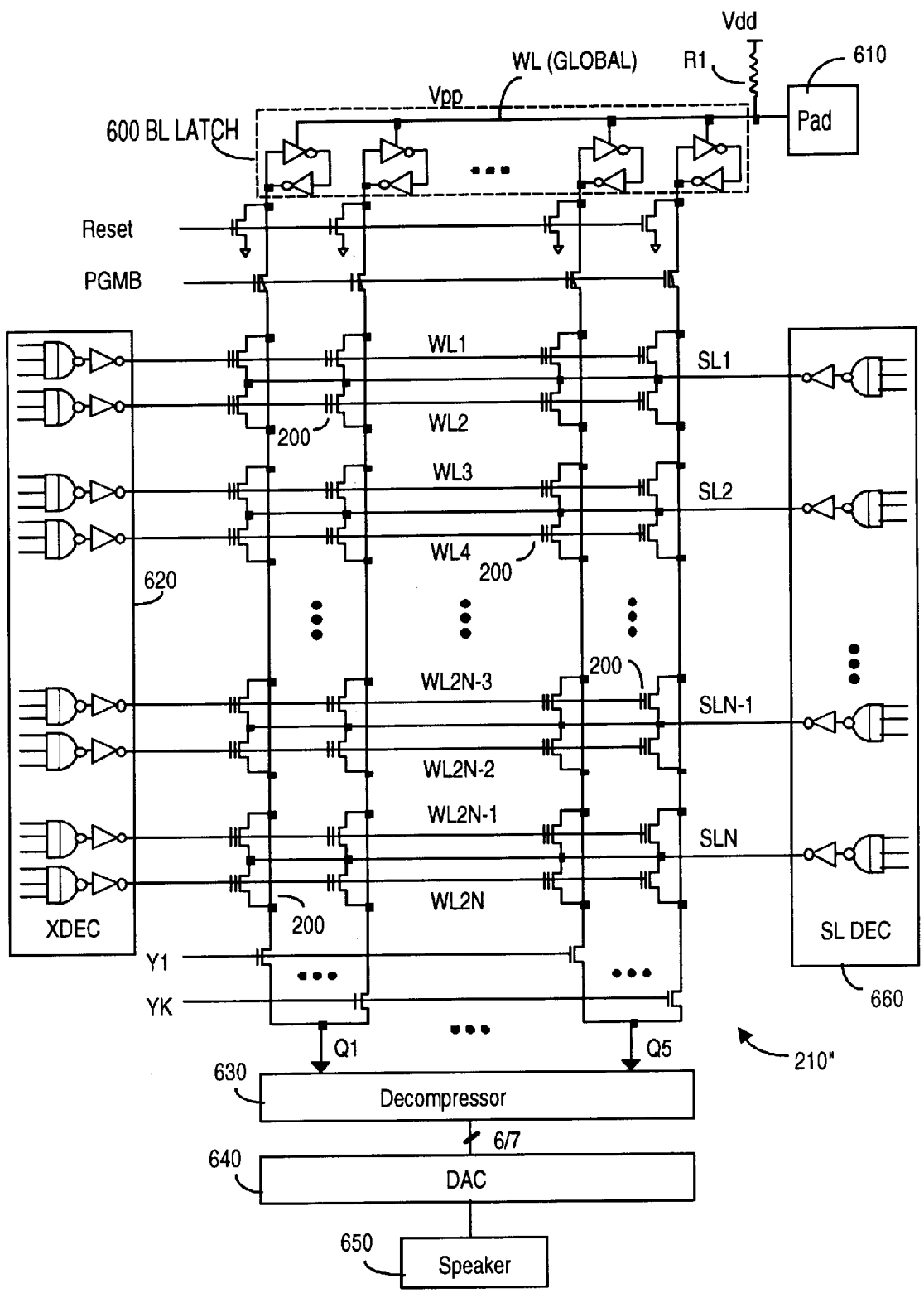

Turning now to FIGS. 15A and 15B, NAND-type and NOR-type arrays are respectively shown, in which embodiments a SL decoder 660 may be used to implement erasure from array bottom-to-top. If array erasing is to be carried out top-to-bottom, SL decoder 660 is not necessary.

Figure 15C:
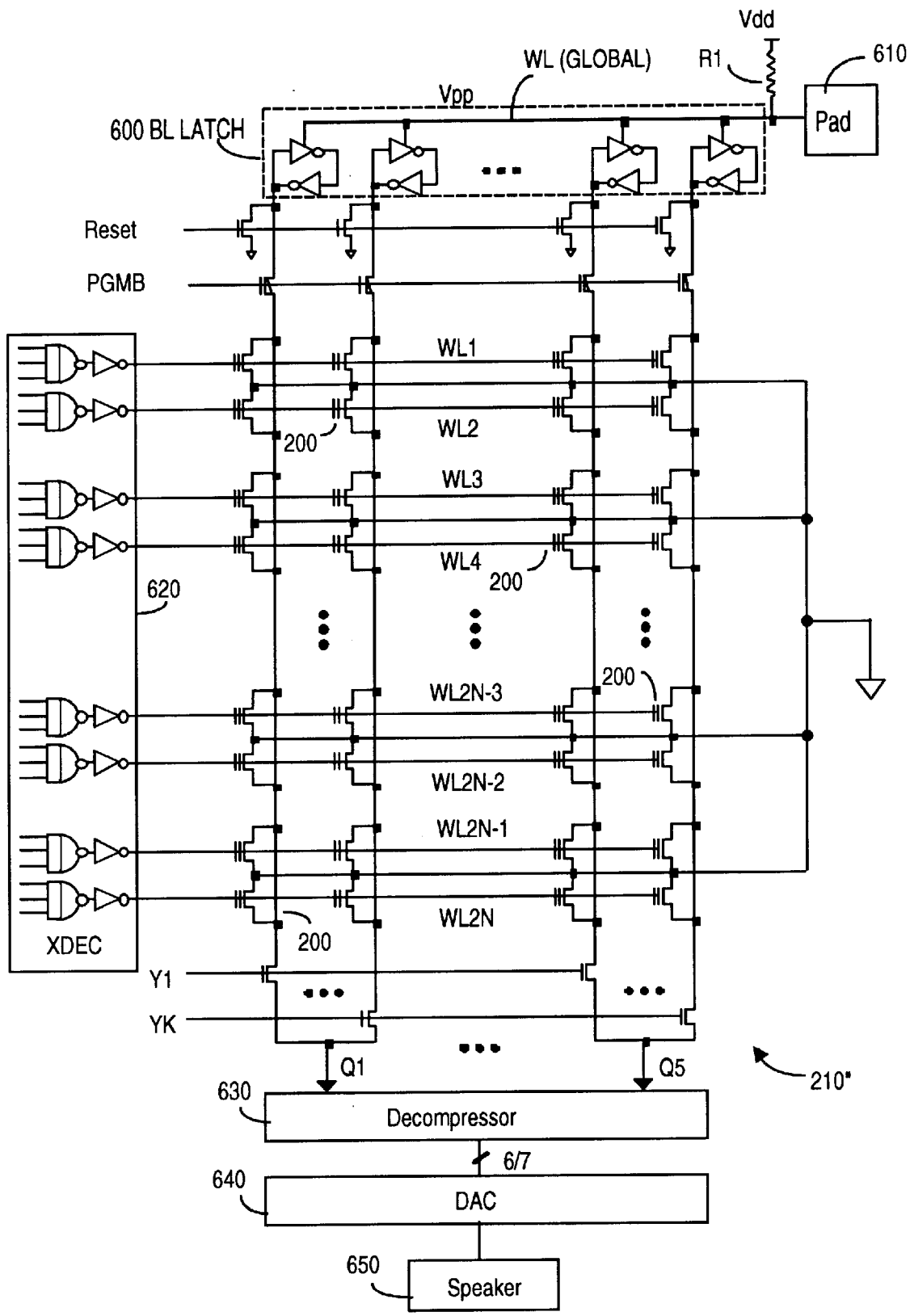
FIG. 15C depicts a NOR-type memory array in which source line decoding is eliminated, according to the present invention.

In the NOR-type array of FIG. 15C, all SLs are grounded, and thus SL decoder 660 is omitted, not unlike an array of conventional memory cells that are operated in conventional fashion. Arrays that can function without an SL decoder obviously benefit by saving the IC chip area the SL decoder and associated traces would have demanded. However, erasure performance is reduced in that without a SL decoder, the ability to erase single and multiple WLs is lost. Absent a SL decoder, typically single BLs or multiple BLs up to the entire array will be simultaneously erased. Generally, but for the inclusion of memory cells 200 and the use of low voltage programming and erasing, the configuration of FIG. 15C is similar to prior art arrays in which there is no SL division.

If SL decoder 660 is present, as in FIGS. 15A and 15B, SL decoder 660 preferably uses AND-type logic to decode input address signals to generate SL drive signals, e.g., SL1, SL2, . . . SLM where 5V is output to selected SLs, and 0V is output to deselected SLs.

Grounding all BLs and WLs permits single or multiple WLs to be HHI erased. (If desired, deselected WLs may be coupled to 6V to pass the BL and SL voltages in NAND-type arrays.) Selective SL-HHI erasure occurs because the selected 5V SL potential induces sub-threshold current in the selected memory cells 200, as has been described.

Alternative BL-selective erasing may also be practiced with the embodiments described herein, in which the SL decoder provides 0V to all SLs (or in the absence of a SL decoder, all SLs are grounded, e.g., FIG. 15C). Selected BLs receive 5V and deselected BLs are grounded. Grounding all WLs (although deselected WLs may receive 6V as above-described) permits single or multiple BLs to be HHI erased as a result of the 5V applied to selected BLs.

Note, however, that configurations for page-erase for SL-selective erase and for BL-selective erasure differ. For page-erase SL-select erase, the WLs preferably are formed in a horizontal WL orientation, whereas in the BL-selective erase configuration, the WLs preferably are formed in a vertical (BL) orientation.

While HHI erase and CHE programming preferably are practiced using low (≦7V) voltage, higher voltages may of course be used. Using low or high voltage, HHI may advantageously be used to erase cells in NOR-type and in NAND-type arrays. HHI erasure advantageously can be carried out with low current, e.g., <1 nA/cell, and for essentially any cell Vt value. If cell Vt exceeds UV-Vt, then magnitudes of WL, BL, or SL potentials will be increased providing that poly1-gate potential is not higher than poly1-Vt. Functionally symmetrical and interchangeable source and drain regions can effectively double cell endurance lifetime. Cells may store data in binary fashion or with multiple levels. A multi-level cell exhibits multiple Vt values, which may be controlled step-wise with changes to WL, BL, or SL potential. While WL potential can be negative to force cell Vt to be negative (to erase), SL and BL potentials will be positive to ensure a high, positive electric field on BL or SL to carry out HHI. Thus, varying cell control gate potential from negative to positive provides a flexible method to adjust cell Vt to control HHI erasure.

Modifications and variations may be made to the disclosed embodiments without departing from the subject and spirit of the invention as defined by the following claims.

What is claimed is:

1. A method of erasing and proarramming data from memory cells in an array on an integrated circuit (IC), the method comprising the following steps:
   (a) providing said array with a plurality of said memory cells, in which each memorv cell has a cell threshold voltage Vt and includes a metal oxide semiconductor (MOS) device having a control gate, a floating gate, and functionally symmetrical source and drain regions;
   (b) erasing data from at least some of said memory cells by exposing those memory cells to ultraviolet light to increase said Vt; and
   (c) programming data into at least some of said memory cells by injecting hot-holes into a chosen one of said source and drain regions to decrease said Vt.

2. The method of claim 1, wherein step (c) includes inducing a sub-threshold drain-source current in chosen ones of said memory cells.

3. The method of claim 1, wherein step (c) is carried out by coupling a source of positive voltage of less than about 7 V to drain regions of memory cells to be programmed, and by coupling a smaller positive voltage that may be zero volts to source regions of memory cells to be programmed, and by coupling a smaller positive voltage that may be zero volts to control gate regions of memory cells to be programmed.

4. The method of claim 1, wherein step (c) is carried out by coupling about 5 V to drain regions of memory cells to be programmed, and by coupling about 0 V to source regions and to control gate regions of memory cells to be programmed.

5. The method of claim 1, further including providing said IC with means for monitoring effectiveness of programming individual ones of said memory cells in said array.

6. The method of claim 5,
   further including providing means for switching, coupled to said means for monitoring effectiveness and coupled to said memory cells;
   wherein said means for switching interchanges electrical connections between source and drain regions of memory cells determined by said means for monitoring to exhibit deteriorated programming efficiency.

7. The method of claim 1, wherein step (c) includes programming at least some said memory cells to store more than two levels of data.

8. The method of claim 1, wherein step (c) includes programming at least some of said memory cells to store more than two levels of data by causing a plurality of different Vt levels, said plurality being selected from a group consisting of (i) all positive values of said Vt, and (iii) positive and negative values of said Vt.

9. The method of claim 1, wherein step (c) includes programming at least some of said memory cells to store more than two levels of data by coupling to control gates of said memory cells to be so programmed a source of potential that is varied in magnitude to create multiple values of said Vt.

10. The method of claim 1, wherein said array is a NAND-type array.

11. The method of claim 1, wherein:
   at step (b), exposure to said ultraviolet light turns-off chosen ones of said memory cells; and
   at step (c), injecting hot-holes turns-on chosen ones of said memory cells.

12. The method of claim 1, wherein said array is a NOR-type array.

13. The method of claim 1, wherein programming at step (c) is carried out with bit-size resolution.

14. The method of claim 1, wherein programming at step (c) is carried out with byte-size resolution.

15. The method of claim 1, wherein at least one group of said memory cells has said control gates coupled together to define addressable wordlines (WLs), have sources coupled together to define addressable sourcelines (SLs), and have drains coupled together to define bitlines (Bls); and
   wherein step (c) further includes:
   using said hot-hole injection to serially program chosen ones of said memory cells in a sequence that includes:
      (i) logically addressing a first WL coupled to chosen ones of said memory cells;
      (ii) providing BL latches that are logically reset and then loaded with input data to be programmably stored in said chosen ones of said memory cells;
      (iii) addressably coupling to selected ones of said WLs and deselected ones of said WLs a train of voltage pulses having different pulse amplitudes, and addressably coupling to selected ones of said BLs and deselected ones of said BLs a train of voltage pulses having different pulse amplitudes; and
      (iv) monitoring said Vt for said chosen ones of said memory cells to confirm that said Vt has been decreased in magnitude to at least a predetermined value;
   if step (iv) verifies sufficient decrease in magnitude of said Vt, repeating step (i) for an incremented address of said WL; and then repeating steps (ii), (iii) and (iv) for memory cells associated with a so-incremented WL address;
   if step (iv) does not verify sufficient decrease in magnitude of Vt, repeating step (iii) with a decreased magnitude of pulse train potential for selected said WLs, and then repeating step (iv) until said Vt has been sufficiently decreased; and
   repeating steps (i), (ii), (iii) and (iv) as needed until memory cells coupled to all desired said WLs have been programmed.

16. The method of claim 1, wherein Vt is controllably adjusted in magnitude by coupling a source of potential to said drain region and varying magnitude of said potential to ensure said hot-hole injection.

17. An integrated circuit (IC) including:
   a plurality of UV-erasable memory cells able to store at least two levels of data per memory cell and addressably arranged in an array, each of said memory cells having a cell threshold voltage Vt and comprising a metal oxide semiconductor (MOS) device having a control gate, a floating gate, and functionally symmetrical source and drain regions; and
   means, coupleable to a source of voltage not exceeding about 7V, for injecting hot-holes into a chosen one of said source and drain regions of addressable ones of said memory cells;
   wherein injection of said hot-holes decreases said Vt to program said cells.

18. The IC of claim 17, wherein said means for injecting couples about 5 V to drain regions of memory cells to be programmed, and couples a smaller positive voltage that may be zero volts to source regions of memory cells to be programmed, and couples a smaller Dositive voltage that may be zero volts to control gate regions of memory cells to be programmed.

19. The IC of claim 17, wherein said IC further includes:

means for monitoring effectiveness of programming individual ones of said memory cells in said array; and means for electrically interchanging electrical connections between source and drain regions of memory cells determined by said means for monitoring to exhibit deteriorated programming efficiency.

20. The IC of claim 17, wherein said array has a configuration selected from a group consisting of:

(a) a NAND-type array; and (b) a NOR-type array.

* * * * *

UNITED STATES PATENT AND TRADEMARK OFFICE
CERTIFICATE OF CORRECTION

PATENT NO. : 5,953,255
DATED : September 14, 1999
INVENTOR(S) : Lee

It is certified that error appears in the above-identified patent and that said Letters Patent is hereby corrected as shown below:

Column 11, line 30 (inside table 3, column 4), delete "120nA, 5V" and insert therefor --10nA, 5V--.

Column 16, line 61, delete "$\leq 55V$" and insert therefor --$\leq 5V$--.

Signed and Sealed this

Fifth Day of December, 2000

Attest:

Q. TODD DICKINSON

*Attesting Officer*          *Director of Patents and Trademarks*